(12) United States Patent
Poon et al.

(10) Patent No.: US 6,597,435 B2
(45) Date of Patent: Jul. 22, 2003

(54) RETICLE STAGE WITH REACTION FORCE CANCELLATION

(75) Inventors: Alex K Tim Poon, San Ramon, CA (US); W. Thomas Novak, Hillsborough, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/971,923

(22) Filed: Oct. 9, 2001

(65) Prior Publication Data

US 2003/0067592 A1 Apr. 10, 2003

(51) Int. Cl.[7] .............................................. G03B 27/62
(52) U.S. Cl. .......................................... 355/75; 355/72
(58) Field of Search ............................. 355/72, 75, 53

(56) References Cited

U.S. PATENT DOCUMENTS

| | | | |
|---|---|---|---|
| 4,952,858 A | 8/1990 | Galburt | |
| 5,327,060 A | 7/1994 | Van Engelen et al. | |
| 5,623,853 A | * 4/1997 | Novak et al. | ............ 355/53 |
| 5,815,246 A | 9/1998 | Sperling et al. | |
| 6,246,204 B1 | * 6/2001 | Ebihara et al. | ........... 318/566 |
| 6,271,606 B1 | * 8/2001 | Hazelton | ............ 250/491.1 |
| 6,366,342 B2 | * 4/2002 | Tanaka | ............ 250/492.2 |
| 6,449,030 B1 | * 9/2002 | Kwan | ............ 355/72 |

FOREIGN PATENT DOCUMENTS

| | | |
|---|---|---|
| EP | 1 111 470 A2 | 6/2001 |
| JP | 2001-267226 | 9/2001 |

OTHER PUBLICATIONS

U.S. patent application Ser. No. 09/797,831, Tanaka, filed Mar. 5, 2001.

* cited by examiner

*Primary Examiner*—Russell Adams
*Assistant Examiner*—D. Ben Esplin
(74) *Attorney, Agent, or Firm*—McGuireWoods LLP

(57) ABSTRACT

A three-degree-of-freedom guideless reticle stage is used with a reaction force-countermass assembly. An anti-gravity device such as a flexure is provided between the reticle stage and the reaction force-countermass assembly. The anti-gravity device offsets the weight of the stage to the reaction force-countermass assembly. Improved reticle-positioning is provided, with minimized distortion to the stage base, reduced forces on the frame, high servo bandwidth, three-degree-of-freedom positioning, high throughput, minimized geometry and low moving mass.

30 Claims, 16 Drawing Sheets

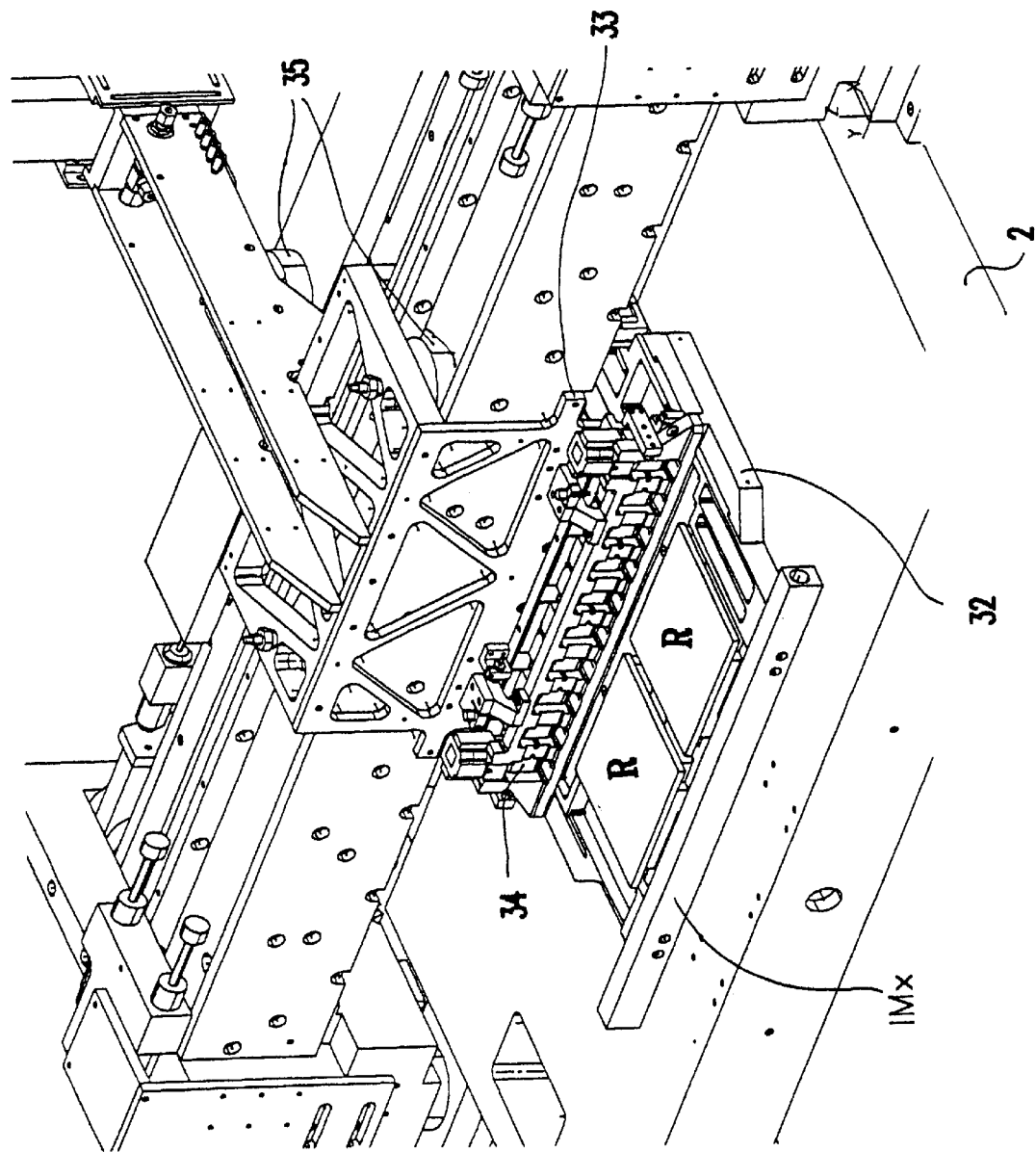

RETICLE STAGE WITH REACTION FORCE CANCELLATION

BACKGROUND OF THE INVENTION

1. Field of the Invention

This invention relates to precision motion stages and more specifically to a stage suitable for use in a lithography machine and especially adapted for supporting a reticle.

2. Description of the Prior Art

In semiconductor manufacture, a medium such as light or non-visible radiation (e.g., DUV or a charged particle beam) is projected through a "reticle" (or mask) to pattern a resist on a wafer to allow selective processing. Positioning a reticle during these lithography processes has been accomplished by a stage that supports the reticle. An illumination system illuminates a reticle supported on a reticle stage and a lens system projects the reticle pattern on a target. The reticle has a specified pattern, such as a circuit, formed on the surface that is to be projected by a projection exposure system, onto the surface of a wafer, while the wafer is positioned on a "wafer stage" separate from the reticle stage. Accurately positioning the reticle is important, so that the corresponding wafer will be made as intended to produce, for example, an array of many electric devices.

Conventional reticle stages provide relatively precise motion in the X-axis and Y-axis directions, and sometimes slight motion in the vertical (Z-axis) direction. A reticle stage is generally used when the reticle is scanned to facilitate compensation of aberration. Conventional stages attempt, with varying degrees of success, to provide as smooth and precise scanning motion as possible, and accurate reticle to wafer alignment. "Yaw", or rotation in the X-Y plane, is another problem in conventional reticle stages.

Most conventional reticle stages have been two-dimensional (sometimes referred to as "XY") (e.g., U.S. Pat. No. 6,188,195 issued Feb. 13, 2001, to Lee, entitled "Exposure Method, and Method of Making Exposure Apparatus Having Dynamically Isolated Support Structure). Another development in a two-dimensional stage was one in which force generating elements of the stage assembly are supported by a "reaction frame" independent from the electron beam or optical column and from the weight of the reticle stage plate. U.S. Pat. No. 6,130,490 that issued Oct. 10, 2000, entitled "X-Y Stage with Movable Magnet Plate" is exemplary of such an arrangement.

Also, reticle stage technology has developed based on the recognition that the guide structure that was located in early reticle stage designs directly under the reticle stage interferes with directing light or an e-beam and may cause position degradation and a source of transmitted vibration through the reticle and through the stage to the underlying projection lens. Hence, efforts began to remove the guides and so-called "guideless" reticle stages have been developed.

While reticle stage technology mainly has been in the area of XY stages, recently introducing a third degree of freedom to reticle stage movement has been proposed. U.S. Pat. No. 6,147,421, to Takita, Novak and Hazelton, entitled "Platform Positionable in at least three degrees of freedom by interaction with coils" mentions wafer positioning and reticle positioning. Takita et al. provide a platform positionable in at least three degrees of freedom by using a system of multiple magnets and multiple coils. Magnets are attached to the platforms and interact with coils to provide motion. Takita et al. make use of inner and outer platforms coupled by magnet bearings so that the inner platform is capable of relative motion with respect to the coils.

Reticle stage systems that have been proposed of the three-degree-of-freedom type do not necessarily permit easiest access to other parts of a photolithography system, nor do they necessarily provide maximal freedom in the third dimension.

SUMMARY OF THE INVENTION

The invention provides a three-degree-of-freedom precision stage which is suited for use as a reticle stage in photolithography manufacturing equipment. Additionally, this invention can be used for a wafer stage instead of a reticle stage as far as permitted.

For realizing such advantages, the invention in a preferred embodiment provides an apparatus comprising: a stage; a reaction force countermass assembly; and an anti-gravity device between the reticle stage and the reaction force countermass assembly. The anti-gravity device is configured to offset the weight of the stage to the reaction force countermass assembly.

In a second preferred embodiment, the invention provides a method of offsetting weight of a stage to a reaction force countermass assembly, comprising the step of: for a stage and a reaction force countermass assembly, configuring an anti-gravity device to offset the weight of the stage to the assembly.

In a third preferred embodiment, the invention provides an exposure apparatus comprising: an illumination system that irradiates radiant energy; and an apparatus comprising: a stage; a reaction force countermass assembly; and an anti-gravity device between the stage and the reaction force-countermass assembly, the anti-gravity device configured to offset the weight of the stage to the reaction force-countermass assembly. In the inventive exposure apparatus, the apparatus disposes an object on a path of the radiant energy.

In a fourth preferred embodiment, the invention provides a device manufactured with the inventive exposure apparatus.

Further perfecting features of the inventive apparatuses and methods are as follows. The stage may be a reticle stage, such as a fine reticle stage or a coarse reticle stage. Anti-gravity devices may support the stage on a pair of reaction force-countermass assemblies located adjacent to the stage. The stage may be in contact with anti-gravity devices extending from a single reaction force-countermass assembly located on one side of the stage.

BRIEF DESCRIPTION OF THE DRAWINGS

The foregoing and other objects, aspects and advantages will be better understood from the following detailed description of a preferred embodiment of the invention with reference to the drawings, in which:

FIGS. 7A, 7B, 7C, 7D and 7E are perspective views of a photolithography apparatus according to the invention.

In the accompanying drawings, taken in conjunction with the accompanying descriptions, similar reference characters refer to similar parts.

DETAILED DESCRIPTION OF A PREFERRED EMBODIMENT OF THE INVENTION

Figure 1A:
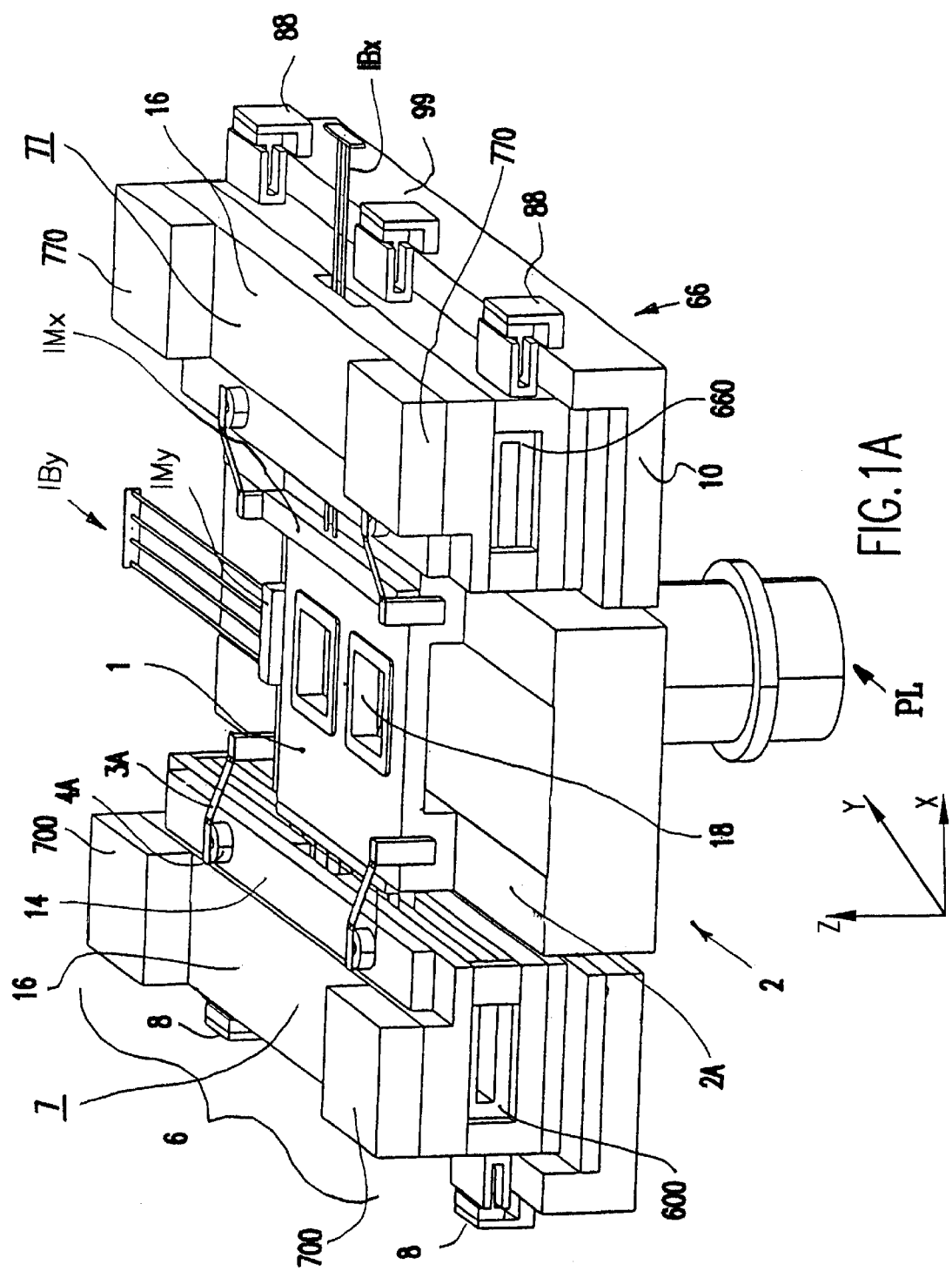
FIG. 1A is a perspective view of an exemplary apparatus according to the invention.

Referring now to the drawings, and more particularly to FIGS. 1A through 7E, there are shown photolithography apparatuses of exemplary form in accordance with preferred environments of the invention.

As shown in FIG. 1A, an exemplary apparatus according to the invention includes a reticle stage such as reticle stage 1 and a reaction force countermass assembly such as reaction force countermass assembly 6 or 66. The reticle stages 1 and reaction force-countermass assemblies 6, 66 shown in FIG. 1A may be modified and varied, such as variations shown in FIGS. 4 through 7E. The reticle stage 1 is coupled to a reaction force countermass assembly 6, 66 by air bearings 4A–4D of anti-gravity devices 3A–3D and magnetic fields generated by motors 5 and 55. Reticle stages 1, anti-gravity devices 3A–3D, and reaction force countermass assemblies 6, 66 are each discussed below, in turn.

The reticle stage 1 in FIG. 1A has a long Y, short X and small $\theta_z$ strokes. (In the figures, x and y axes are shown for convenience of reference, and are not intended to be limiting.) A "Y" typical stroke for a stage according to FIG. 1A is in the range of about 300 to 600 mm. An "X" typical stroke for a stage according to FIG. 1A is in the range of about 1 to 10 mm. The $\theta$ strokes typically provided by a reticle stage 1 according to FIG. 1A are about 0.1 to 3 degrees. The reticle stage 1 in FIG. 1A is a slider assembly. As shown in FIG. 1A, the reticle stage 1 accommodates two reticles, which, in use, are placed on reticle chunks disposed over each aperture 18 in the reticle stage (slider assembly) 1. One skilled in the art will appreciate that a moving reticle stage readily may be machined with one, two or more apertures for accommodating a reticle at each aperture. In operation, the Y stroke will be longer with a multi-reticle slider versus a single reticle stage.

FIG. 1A shows a preferred embodiment of the invention, in which a reticle stage 1 is provided. The interferometer beam $IB_y$ (to measure position of the reticle stage 1 along Y axis and about Z axis) is shown, in relation to interferometer mirror $IM_y$, with the interferometer beam originating from a laser interferometer which monitors position of the movable reticle stage 1. The interferometer beam $IB_x$ and interferometer mirror $IM_x$ are utilized to measure position of the reticle stage along the X axis. Measurement of the reticle position in three-dimensions may be carried out using existing technology, such as interferometer techniques known to those in the art. See, e.g., U.S. Pat. No. 6,122,059 to Inoue et al, issued Sep. 19, 2000, entitled "Scanning Exposure Apparatus and Device Fabrication Method in Which Multiple Laser Interferometers Use a Respective Laser Head." As far as is permitted, the disclosure in U.S. Pat. No. 6,122,059 is incorporated herein by reference. The interferometer measuring system supplies position information (X, Y, $\theta_z$) to the reticle stage control system (not shown), and to the main control system (not shown). Reticle stage control systems and main control systems for lithography have been used in the art. Based on the position information, the main control system controls the position and the velocity of the reticle stage 1 through the reticle stage control system.

Figure 4:
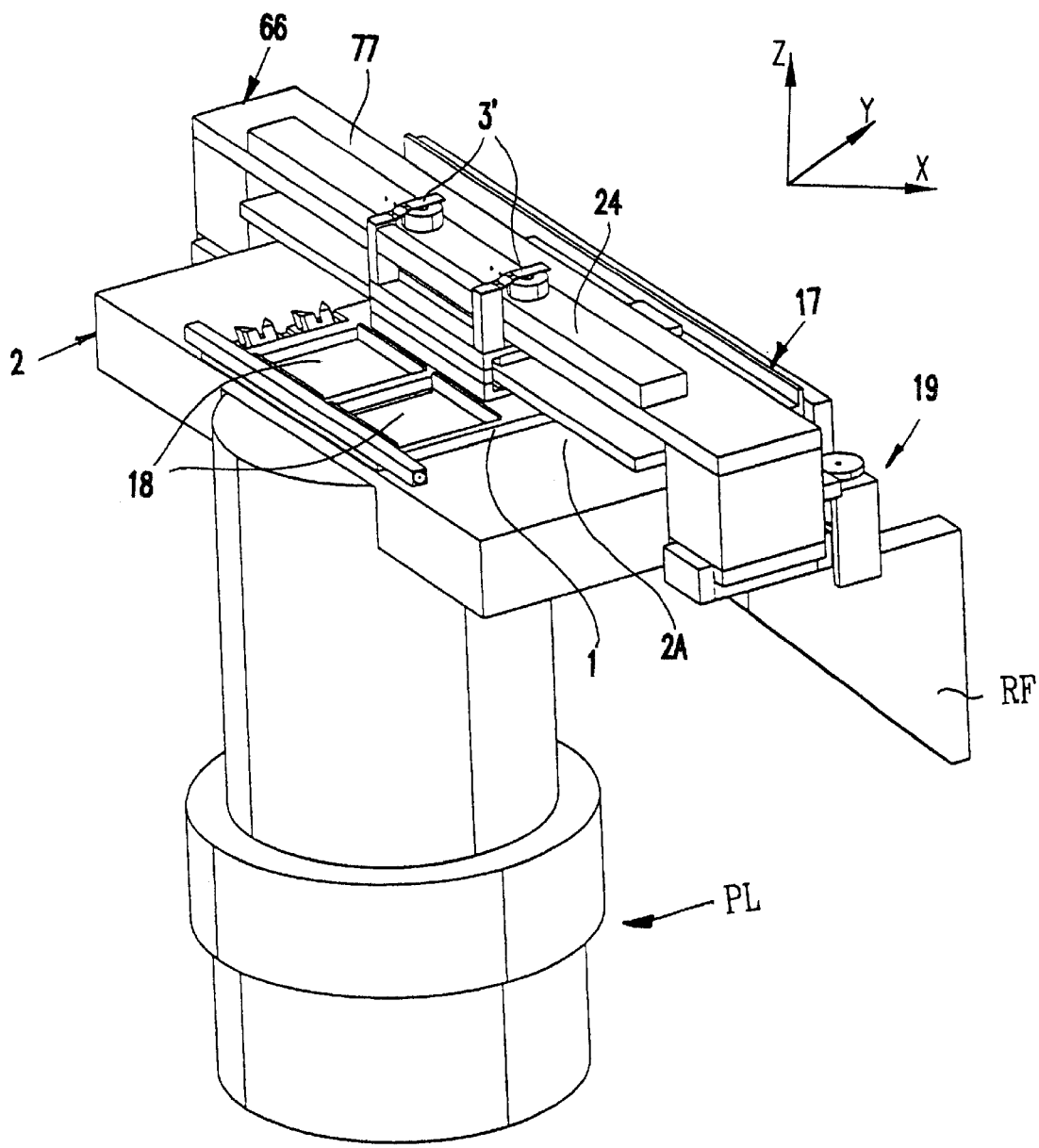
FIG. 4 is a perspective view of a reticle stage according to the invention.

The movable reticle stage 1 of FIGS. 1A and 4 is shown disposed with regard to a projection lens PL (as an optical system) as would be a conventional placement of a reticle stage and a projection lens in photolithography systems. However, it will be appreciated that conventional lithography systems do not use a movable reticle stage 1 as their reticle stage, and generally have additional and/or different components from the reticle stage assembly of FIG. 1A.

The reticle stage 1 shown in FIG. 1A has a body 1B in which is disposed at least one aperture 18 for passing an exposure beam directing the projection lens PL, with two apertures 18 shown in FIG. 1A. Although the body in FIG. 1A is shown as U-shaped in cross-section, the body may be shaped otherwise. The reticle stage 1 is preferably made of lightweight but stiff material such as a ceramic. Although FIG. 1A shows two apertures, it will be appreciated that the number of apertures 18 can be varied, and that corresponding changes to the length (y) of the reticle stage 1 are then made.

Figure 2:
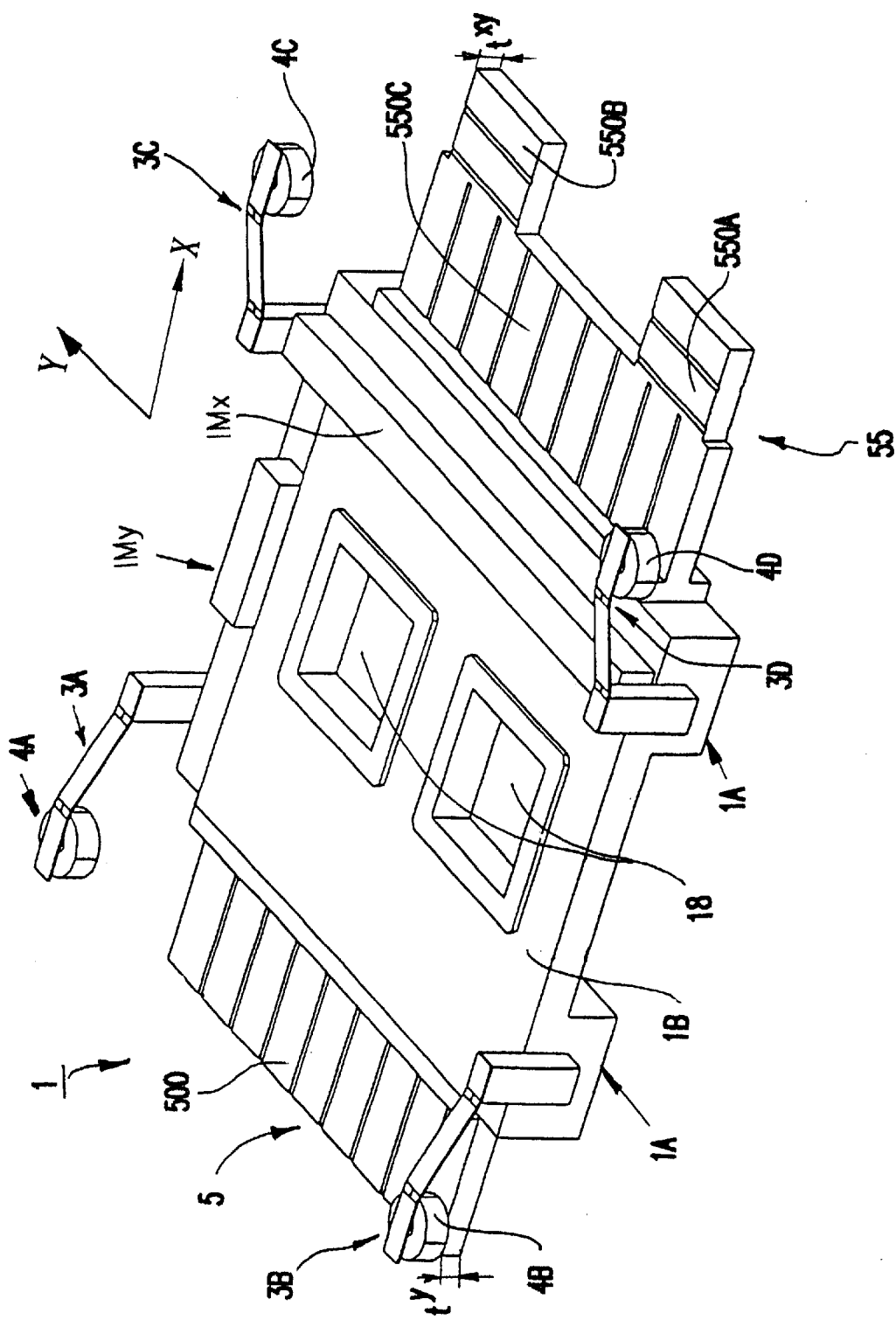
FIG. 2 is a perspective view of a reticle stage according to the invention.

Referring to FIG. 1A, the bottom surface of the reticle stage 1 is disposed above an air bearing surface 2A which is the top surface of a reticle stage base 2 which typically mounts to the lens body of projection lens PL. The lens body is the body structure which also supports the projection lens PL. With reference to FIGS. 1A and 2, the bottom of the reticle stage 1 has air bearings 1A with vacuum pre-load in near contact with the air bearing surface 2A of reticle stage base 2. The term "air bearing" used herein means not only a bearing actuated by air but also a bearing actuated by other gas such as nitrogen or helium. The reticle stage base 2 is mounted to the lens body and remains fixed during operation of the, apparatus. It will be appreciated herein where air bearings are mentioned, other fluid bearings, or other bearings (e.g., air bearing/magnetic combination type) may be used.

In this embodiment, each motor 5 and 55 is a linear motor type actuator. Further, each motor 5 and 55 utilizes a Lorentz type force, and includes a first assembly and a second assembly, which interacts with the first assembly. One of the assemblies includes at least one magnet and the other assembly includes at least one conductor (coil). By supplying electrical current to the conductor, the conductor interacts with a magnetic field generated by the magnet. This causes a force (Lorentz type force) between the magnet and the coil (the first assembly and the second assembly) that can be used to move the reticle stage 1 relative to the reticle stage base 2. The design of each first assembly and second assembly can be varied to suit the design requirement of the apparatus. Further, motors 5 and 55 can use another type of actuator such as an electromagnetic actuator and the combination of a rotary motor and a screw.

The motor 5 includes motor magnets 500 secured to the reticle stage 1, and coil array 600 having a plurality of coils and connected to the reaction force countermass assembly 6. The motor 5 generates Y force along Y direction such as Fsy' shown in FIG. 1C.

Figure 1B:
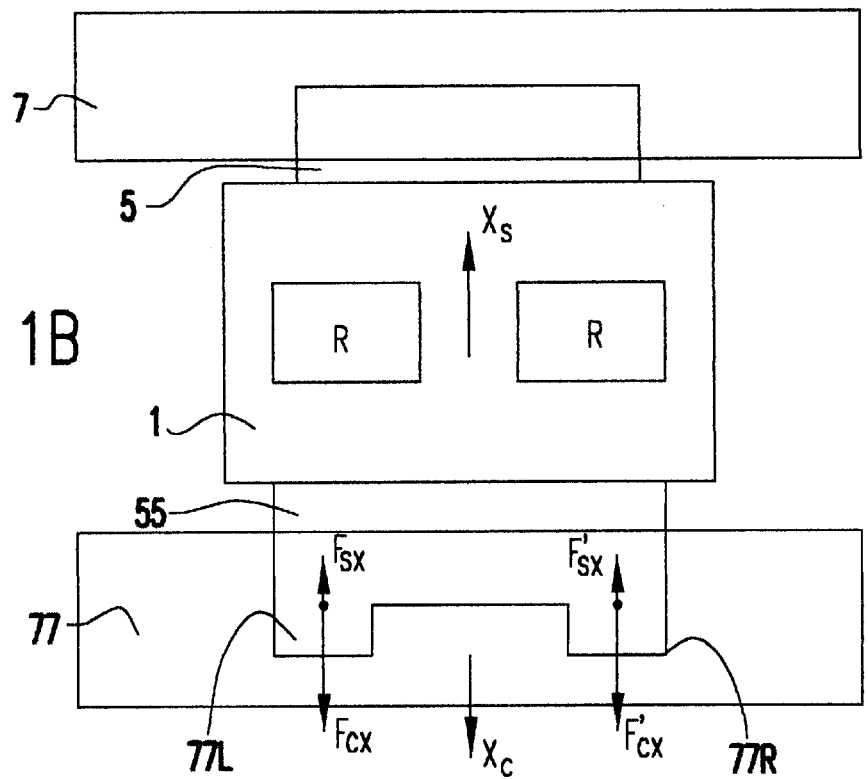
FIG. 1B is a cross-section schematic view showing x motion for an apparatus according to FIG. 1A.

The motor 55 includes motor magnets 550A, 550B, and 550C secured to the reticle stage 1, and coil array 660 having a plurality of coils and connected to the reaction force countermass assembly 66. The motor magnets 550A, 550B, and 550C are united with one C-shaped body as shown in FIG. 2. The first X force section 77L is created by the motor magnets 550A and the coil array 660. The first X force section 77L generates X force along X direction such as Fsx shown in FIG. 1B. The second X force section 77R is created by the motor magnets 550B and the coil array 660. The second X force section 77R generates X force along X direction such as Fsx' as shown in FIG. 1B. The third magnets 550C and the coil array 660 create Y force section that generates Y force along Y direction such as Fsy' shown in FIG. 1C.

Figure 1C:
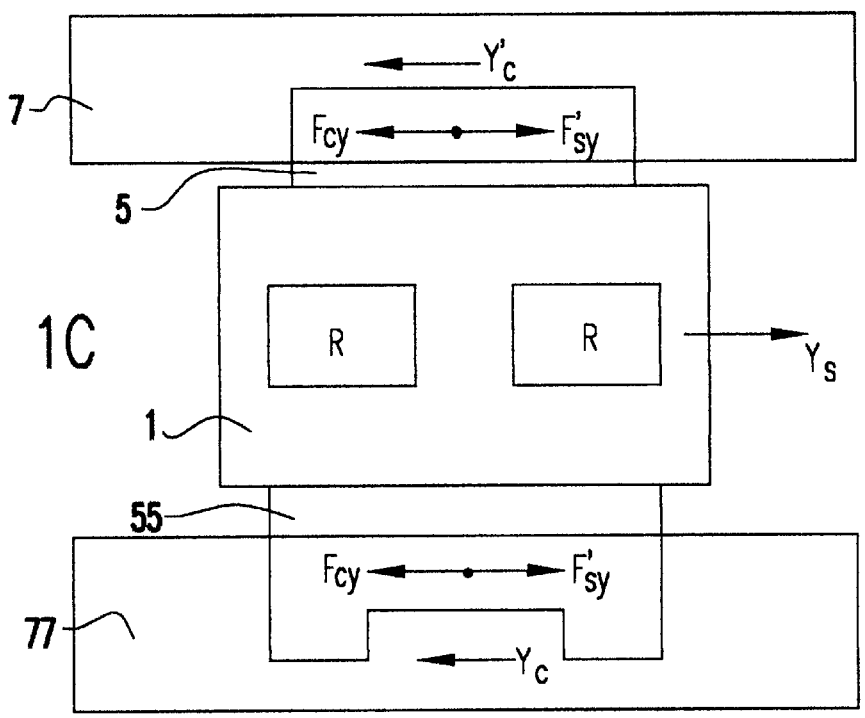
FIG. 1C is a cross-section schematic view showing y motion for an apparatus according to FIG. 1A.

The x motion and y motion, respectively, of an apparatus according to FIG. 1A may be further appreciated from FIGS. 1B and 1C. As shown in FIG. 1B relating to x-motion, motor 5 is inactive. The first X force section 77L of motor 55 pushes the reticle stage 1 with force, Fsx and countermass 77 with reaction force Fcx. Also, second section 77R pushes the reticle stage 1 with force Fs'x and countermass 77 with reaction force Fc'x. Fsx equals Fcx, and Fs'x equals Fc'x. Fsx does not necessarily equal Fs'x. The reticle stage 1 moves in one direction Xs while countermass 77 moves in the opposite direction Xc. The distance (and velocity) ration Xc/Xs is equal to the ratio of the stage mass (ms) to the countermass mass (mc), so that Xc/Xs~ms/mc.

Also from FIG. 1B, the three degrees of freedom, in x, y and $\theta_z$ may be appreciated. The lower countermass 77 can move in Xc direction and also can rotate. If Fx does not equal F'x, then countermass 77 can rotate slightly, providing a rotational degree of freedom (and thus three degrees of freedom) for countermass 77.

Y motion of an apparatus according to FIG. 1A may be appreciated further from FIG. 1C. The Y force section of motor 55 pushes-the reticle stage 1 with force Fsy and countermass 77 with Fcy as a reaction force. Fsy equals Fcy. The motor 5 pushes the reticle stage 1 with force Fs'y and the countermass 7 with force Fc'y as a reaction force. Fs'y equals Fc'y. Fsy does not necessarily equal Fc'y, depending on reticle stage 1 construction and desired motion. The stage 1 moves in direction Ys while countermasses 7; 77 move in the opposite direction Yc, Yc'. The distance ratio Yc/Ys is approximately equal to the ratio of half the stage mass (ms/2) to the countermass mass (mc), so that Yc/Ys~ms/2mc.

The ratio of velocities of the stage 1 and countermasses 7, 77 also roughly equals ms/2mc.

The reticle stage 1 in FIGS. 1A and 2 is provided with anti-gravity devices 3A–3D. Examples of an anti-gravity device are any device that provides a suitable spring constant such as flexures, springs, air or hydraulic pistons, magnets, electrostatic, electromagnetic bearings, air bellows and other pressurized devices. From FIGS. 1A and 2, the functioning of the devices and the reticle stage 1 may be seen. In FIG. 2, the reticle stage 1 has been removed from the apparatus of FIG. 1A, and slightly turned. As shown in FIG. 2, the reticle stage 1 has a "north" side face to which is appended the interferometer mirror IM$_y$ and a "south" side face. (It will be appreciated that such terms as "north" are only for relative reference and do not imply magnetic activity, tool orientation or the like.) Each "north" and "south" face of the reticle stage 1 has rigidly attached thereto, respectively, an "east" and "west" anti-gravity device 3A, 3B, 3C, 3D. Each anti-gravity device 3A etc. has, respectively, its own anti-gravity air bearing 4A, 4B, 4C, 4D attached thereto. (In discussing the figures, devices are referred to as 3A, 3B and air bearings as 4A, 4B etc., for convenience of reference, and the devices and air bearings, respectively preferably are of the same composition and general positioning.)

Anti-gravity devices and air bearings are known in the mechanical arts. More specifically, anti-gravity devices and air bearings in a reticle stage system are known in the art for use in two-dimensional reticle stages, see U.S. Pat. No. 6,087,797 issued Jul. 11, 2000; U.S. Pat. No. 6,175,404 issued Jan. 16, 2001; U.S. Pat. No. 6,151,105 issued Nov. 21, 2000 and U.S. Pat. No. 6,150,787 issued Nov. 21, 2000. Such anti-gravity devices and air bearings are suitable for use in the present invention. As far as is permissible, the disclosures in the above mentioned U.S. patents are incorporated by reference.

In a preferred embodiment, the four anti-gravity devices 3A–3D are symmetrically paired in position, and the anti-gravity devices are of the same materials and construction. Anti-gravity devices such as flexures have been used in reticle stages, see U.S. Pat. No. 6,087,797 issued Jul. 11, 2000 to Lee, entitled "Exposure Method, and Method of Making Exposure Apparatus Having Dynamically Isolated Reaction Frame." As far as is permitted, the disclosure in U.S. Pat. No. 6,087,797 is incorporated herein by reference. The rigidity, length and construction of the air bearing/anti-gravity device combination are such that, in operation of the apparatus, the four anti-gravity air bearings 4A etc. travel smoothly along the top face of the anti-gravity bearing guide 14. Preferably, the anti-gravity bearing guide 14 is made of a hard, smooth material such as anodized aluminum or a ceramic to facilitate the passage of the anti-gravity air bearings 4A etc.

The anti-gravity devices 4A etc. shown in FIG. 1A exemplify anti-gravity devices suitable for use with the reticle stage and the reaction force countermass assembly. Such an anti-gravity device is configured to offset the weight of the stage to the reaction force countermass assembly. The mass ratio of the reaction force counter mass assembly 6 or 66 (countermass 7 or 77) to the reticle stage 1 is high, to minimize the reaction force counter mass motion, thereby minimizing the physical size of the trim motors. In a preferred embodiment, the mass of a reaction force countermass assembly 6 is about five times the reticle stage 1 mass.

Figure 3A:
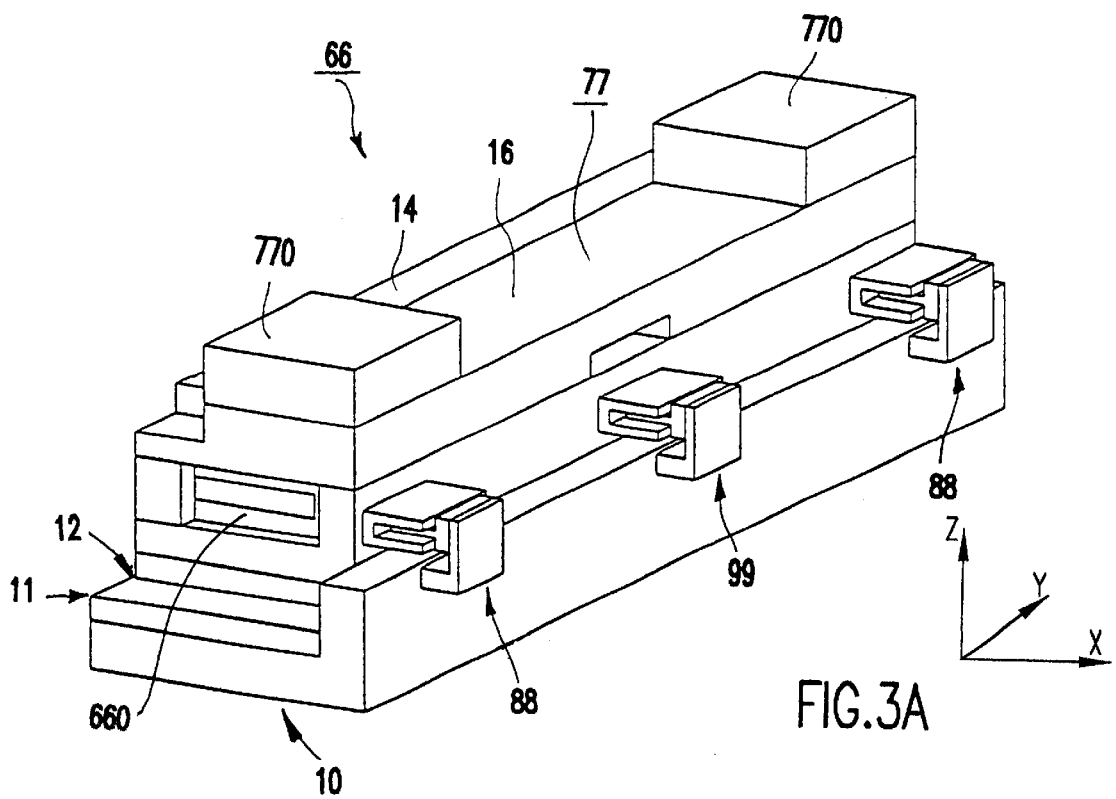
FIGS. 3A and 3B are perspective views of the reaction force counter mass assembly components.
Figure 3B:
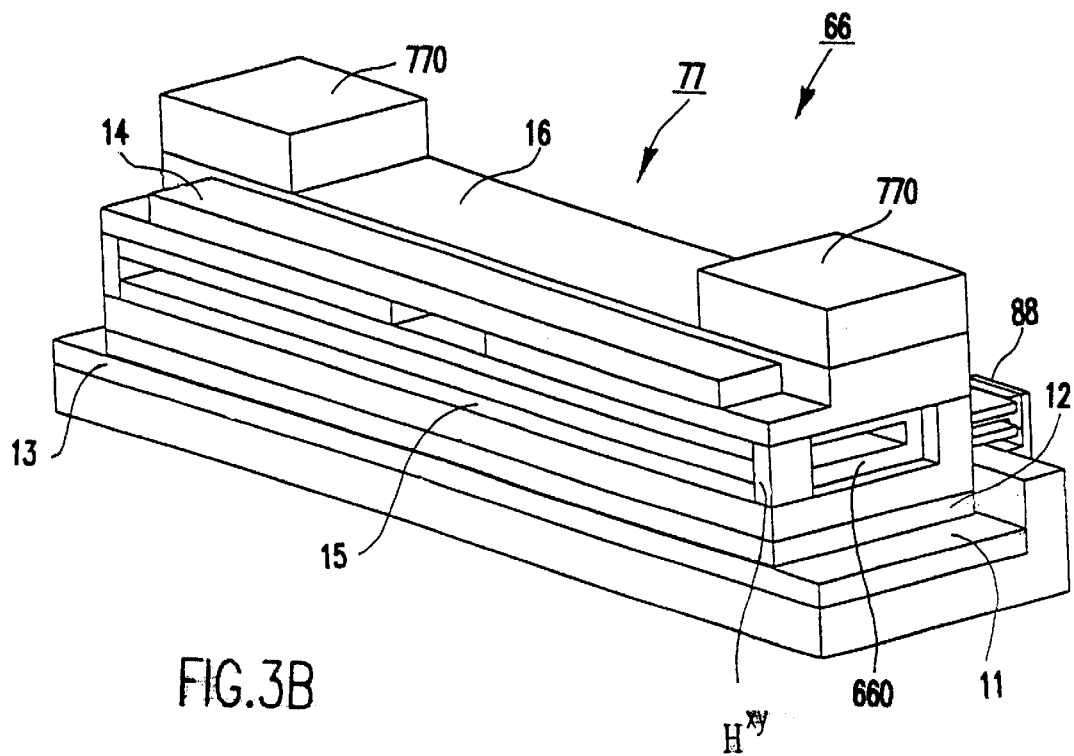

The reticle stage 1 in FIG. 1A is in contact via anti-gravity devices 3A etc. with reaction force counter-mass assemblies 6 and 66, which exemplify reaction force counter-mass assemblies that may be used in the present invention. Each reaction force countermass assembly 6 or 66 is mountable to a countermass support beam 10. FIGS. 3A and 3B show a reaction force counter mass assembly 6 or 66 of FIG. 1A, including its two components (numbers of elements are related to reaction force countermass assembly 66). With reference to FIGS. 1A and 3A, center of gravity (CG) tuning masses 7 and 77 are shown, on top of each reaction force counter-mass assembly 6 and 66 respectively. The four CG tuning masses 7, 77 shown in FIG. 1A are not all the same. The tuning masses 7, 77 are used to adjust the positions of the countermass center of gravity, mainly in the x, z plane.

Figure 1D:
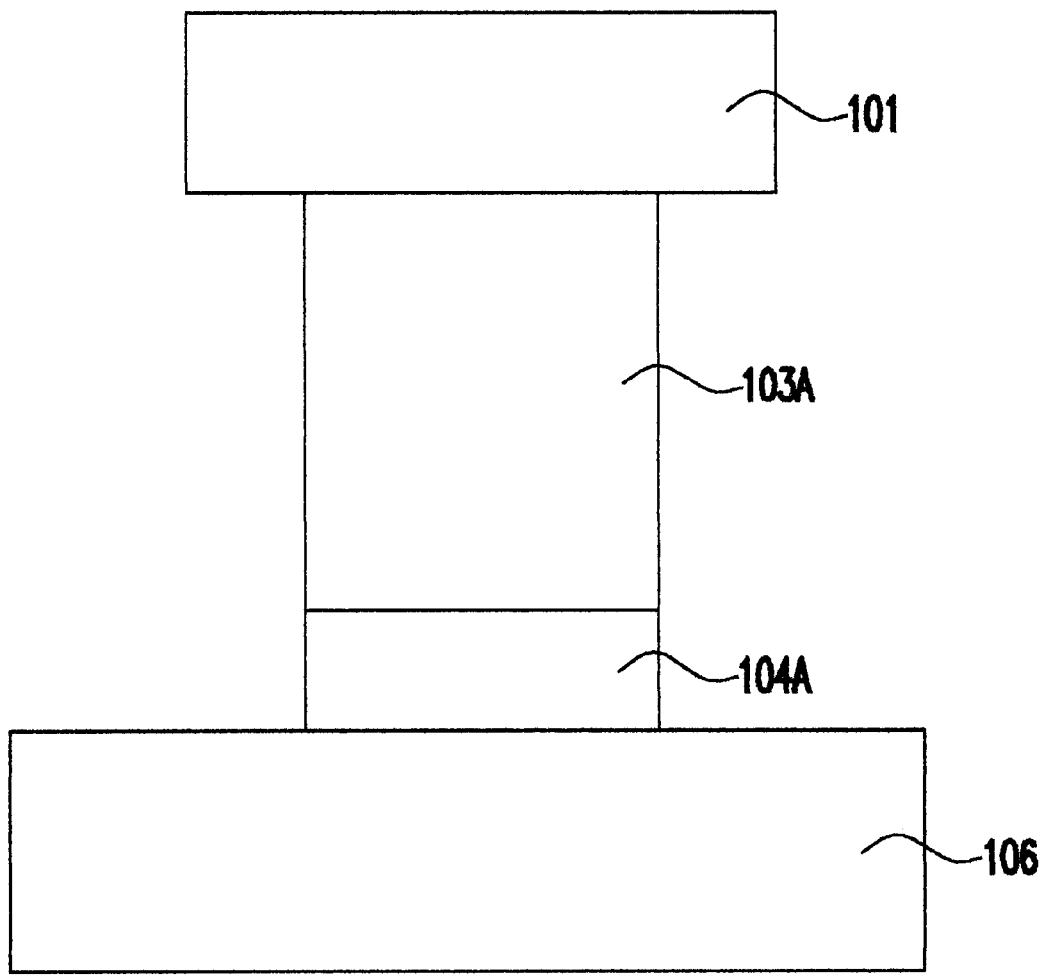
FIG. 1D is a conceptual block diagram of an apparatus according to the invention.

FIG. 1D provides a conceptual block diagram of a stage 101, a countermass assembly 106, an anti-gravity device 103A and a bearing 104A. The purpose of the bearing 104A is to reduce friction between the countermass assembly 106 and the stage 101 which move in opposite directions. The bearing 104A, according to various embodiments, can be air, fluid, magnetic, or electrostatic and a plurality (two or more) countermass, anti-gravity and bearing assemblies per stge can be used.

In FIGS. 1A and 3A, on the exterior of the apparatus at reaction force countermass assembly 66, a pair of x trim motors 88 flank a y trim motor 99. Likewise, on the exterior of the apparatus at reaction force countermass assembly 6, a pair of x trim motors 8 flank a y trim motor 9.

Each reaction force counter-mass assembly 6 and 66, respectively, has the counter-mass support beam 10. The counter-mass support beam 10 connects to the reaction frame of a photolithography apparatus, and, during operation, support beam 10 including its bearing guide 13 constitutes a fixed part, while the rest of the assembly is movable with respect to the fixed support beam 10. The part of the reaction force countermass assembly 6 or 66 having a slotted track, such as track 15 of reaction force counter-mass assembly 66, in operation, is movable parallel to the support beam 10, as may be appreciated from the fact that reaction force counter mass assembly 66 provides a bearing surface 11 adjoining counter-mass air bearing 12. Bearing guides are provided, including counter-mass bearing guide 13 and anti-gravity bearing guide 14.

In the reaction force countermass assembly 66, a track 15 is provided for the motor magnets 550A, 550B, and 550C of the motor 55 (or alternately, the coil array 660). Reaction force countermass assembly 6 also provides a respective track (not shown) for the motor magnets 500 of the motor 5 (or alternately, the coil array 600), and the track in reaction force countermass assembly 6 is not necessarily required to be at the same height or of the same dimensions as track 15.

The track along which a linear motor magnet travels, such as x/y linear motor magnet track 15, is of such height to permit the corresponding motor magnet (such as the motor magnets 550A, 550B, and 550C of the motor 55 or motor magnets 500 of the motor 5 in FIG. 2) to permit movement of the linear motor magnet along the track. Namely, height $H^{XY}$ of track 15 of reaction force countermass assembly 66 (see FIG. 3B) is at least slightly greater than thickness $t^{XY}$ of the motor magnets 550A, 550B, and 550C of the motor 55.

The reaction force counter mass assemblies (6 and 66 respectively) are located on both sides of the reticle stage 1. For each reaction force counter mass assembly 66, such as countermass 77, a pair of CG tuning masses 770, trim motors 88 and 99 (VCMs/linear motor) and bearing guide (air bearing guides) 13 are provided. Optionally a long magnet track or long coil (depending on the motor design) may be included in the reaction force counter mass assembly 66. This reaction force counter mass assembly 66 may be connected to a reaction frame disposed independently from the reticle stage base 2 and PL.

The reaction force counter-mass assembly 6 or 66 of FIG. 1A may be modified and varied and be useable in the present invention.

With reference to FIGS. 1A and 2, the reticle stage 1 is positioned by two motors 5 and 55. One of the motors, shown in FIG. 2 as 55, generates forces in two directions (X/Y). This motor 55 can be a moving coil or moving magnet type linear motor. In FIG. 2, the motor magnets 550A, 550B, and 550C of the motors 55 is shown C-shaped, for insertion into a magnet track 15, with the magnets 550A, 550B, and 550C of thickness "$t^{XY}$".

With reference to FIG. 2, on the "west" or "y" side of the reticle stage 1 is a motor magnet 500 of the motor 5, which differs from the x,y linear motor magnet 550 on the "east" side of the reticle stage 1. The motor magnets 500 of the motor 5 are of thickness "$t^{Y}$", which is not necessarily equal to thickness "$t^{XY}$" of magnets 550A, 550B, and 550C. Nor is magnet 550 required to be joined to the U-shaped stage body 1B of the reticle stage 1 at exactly the same height as where magnets 550A, 550B, and 550C join the U-shaped stage body 1B of the reticle stage 1.

In FIG. 1A, none of the x, y linear motor magnets 550A, 550B, and 550C is visible and almost none of the y linear motor magnet 550 is visible, but with reference to FIGS. 1A and 2, it can be seen how motor magnets 500 and 550A–C interact with reaction force counter-mass assemblies 6 and 66 respectively.

The four anti-gravity devices 3A–3D each with air bearing 4A–4D etc. offset the weight of the reticle stage 1 to the reaction force counter mass assembly 6 or 66 and to the reaction frame. The construction according to the invention minimizes distortion to the reticle stage base 2 as the reticle stage 1 moves in operation during photolithography. Distortion to the reticle stage base 2 is minimized because the anti-gravity devices 3A etc. offset the weight of the moving mass (the reticle stage 1).

By using the apparatus of FIGS. 1A through 3B, high servo performance is obtained because of the low moving mass. Preferably, the moving mass is on the order of about less than 10 kg.

The center of gravity (CG) of the moving countermass 7, 77 (reaction force countermass assembly 6, 66 except for countermass support beam 10) can be tuned with a pair of CG tuning masses 700, 770 allowing the reaction force to act aligned with the CG. Reaction force cancellation reduces the forces on the frame 16 of each reaction force countermass assembly 6, 66 (a part of the countermass 7, 77).

A preferred embodiment of a reticle stage, according to the invention may be further appreciated from FIGS. 4, 5A, 5B, 6A, and 6B, in which the reaction force counter mass assembly 66 includes a pair of x VCM magnet or coils 17 (including only one reaction force countermass assembly). The x VCMs, along with the single y linear motor, position the carriage assembly. The x VCMs generate forces in the x direction and provide position control in the x and θ directions. A linear motor of the moving coil or moving magnet type may be used. Also, the apparatus includes a trim motor 19 with an encoder. The trim motor 19 shown in the figure is a rotary motor with an encoder. The trim motor encoder maintains the reaction mass position information along the y direction.

Figure 5A:
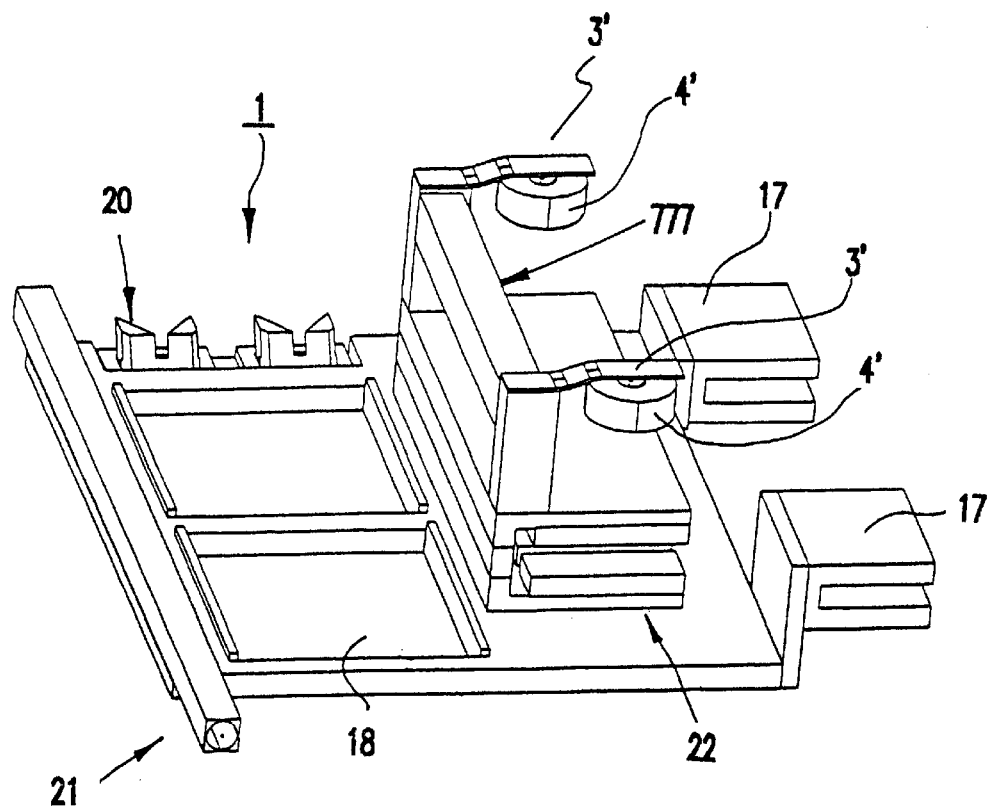
FIGS. 5A and 5B are perspective views of a carriage assembly according to the invention.
Figure 5B:
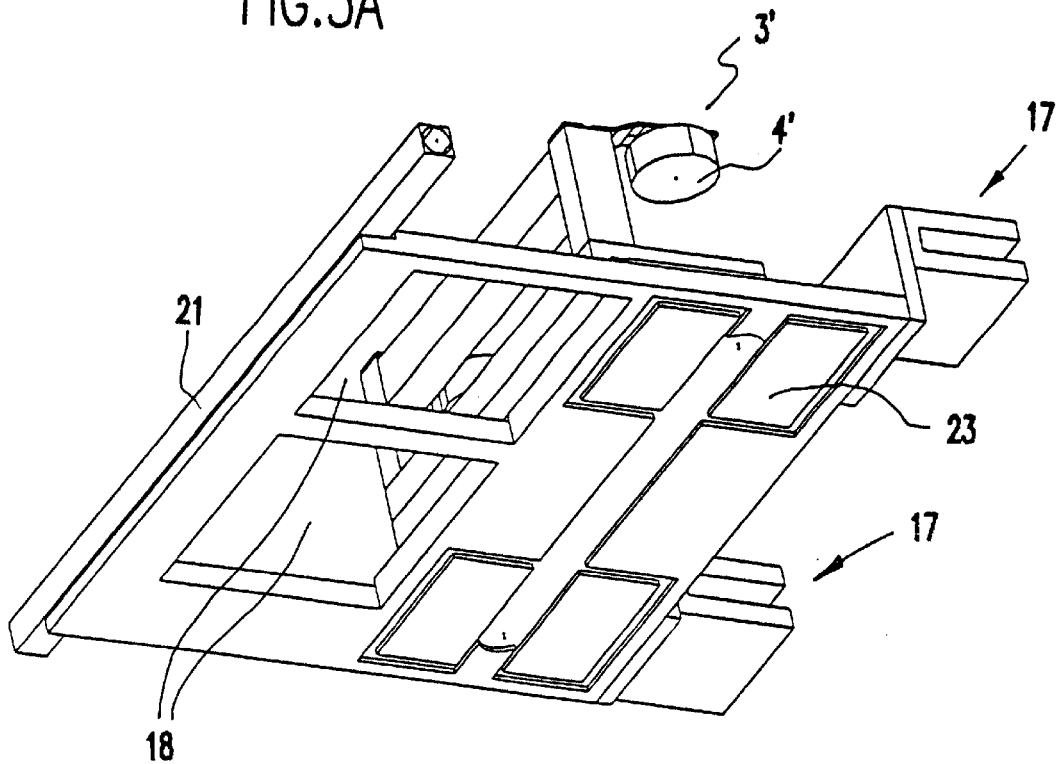

A preferred embodiment of a reticle stage assembly according to the invention may be further appreciated from FIGS. 5A and 5B. Referring to FIG. 5A, the reticle stage 1 includes a y interferometer corner cube 20. The corner cube 20 is used to reflect the interferometer beam back in such a way that the return beam angle does not change, even when the reticle stage 1 is rotated through its nominal range. It is attached to the stage 1 directly with screws or adhesive. An x interferometer mirror 21 is attached, parallel to the reticle apparatuses 18. The y linear motor magnet or coil 220 functions as do magnets 500, 550A–C in FIG. 2. The carriage assembly is positioned by a single y linear motor 22 and two voice coil motors (VCMs) 17. Tuning mass 777 is alternately shaped but functions as does tuning mass 700 or 770 in FIG. 1A.

With respect to FIG. 5B, the anti-gravity device 3' is shown as seen from below. The stage 1 has air bearings 23 that create a vacuum reload type air bearing with the bearing surface 2A of the reticle stage base 2 (shown in FIG. 4). Two anti-gravity devices 3' with air bearings 4' offset the weight of the reticle stage 1 to the reaction force counter mass assembly 66 and the reaction frame RF, minimizing distortion to the reticle stage base 2 as the reticle stage 1 moves. The mass ratio of the reaction force counter mass assembly 66 to the reticle stage 1 preferably is high, to minimize the reaction force counter mass assembly 66 motion and stroke.

One advantage of using an apparatus according to FIGS. 1A through 7E is to minimize distortion to the reticle stage base 2 because of anti-gravity devices 3' offsetting the weight of the moving mass (reticle stage 1) to the outside frame (reaction force countermass assembly 66 and reaction frame RF). A further advantage is that center of gravity of the reaction force mass can be tuned with the tuning mass 7777 (shown in FIGS. 6A and 6B), allowing the reaction force to act in line with the center of gravity. The invention provides for the stage 1 to be moving one way, and the countermass to be moving the other way, with conservation of momentum, while maintaining the overall center of gravity of the system in the same place. By using reaction force cancellation, forces on the frame may be reduced, but not just are the reaction forces to the ground reduced, also the overall center of gravity is maintained in the same place. Further, space is made available for service accessibility. Also desirably, the interferometer unit can be mounted close to the X moving mirror, to maximize the θ range. The Y stroke can be easily increased.

Figure 6A:
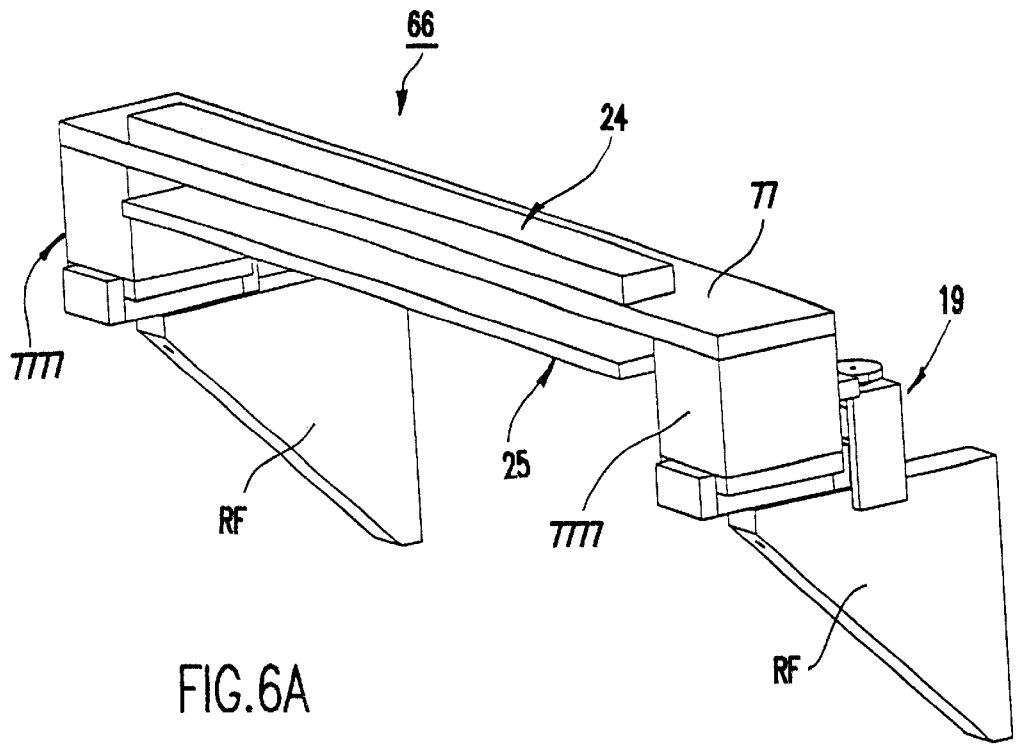
FIGS. 6A and 6B are perspective views of a reaction force counter mass assembly according to the invention.

A preferred embodiment of an exemplary reaction force counter mass assembly 66 according to the invention may be appreciated with respect to FIGS. 6A and B. The reaction force counter mass assembly 66 is configured to be connectible to the reaction frame RF. In FIG. 6A, the reaction force counter mass assembly 66 includes a pair of CG tuning masses 7777. The reaction force counter mass assembly 66 is located near center and above the reticle stage 1. An anti-gravity bearing guide 24 is affixed on top of the reaction force counter mass assembly 66. Under the anti-gravity bearing guide 24, a y coil or magnet 25 of Y linear motor (having substantially the same function of motor 5 or 55) is provided.

Figure 6B:
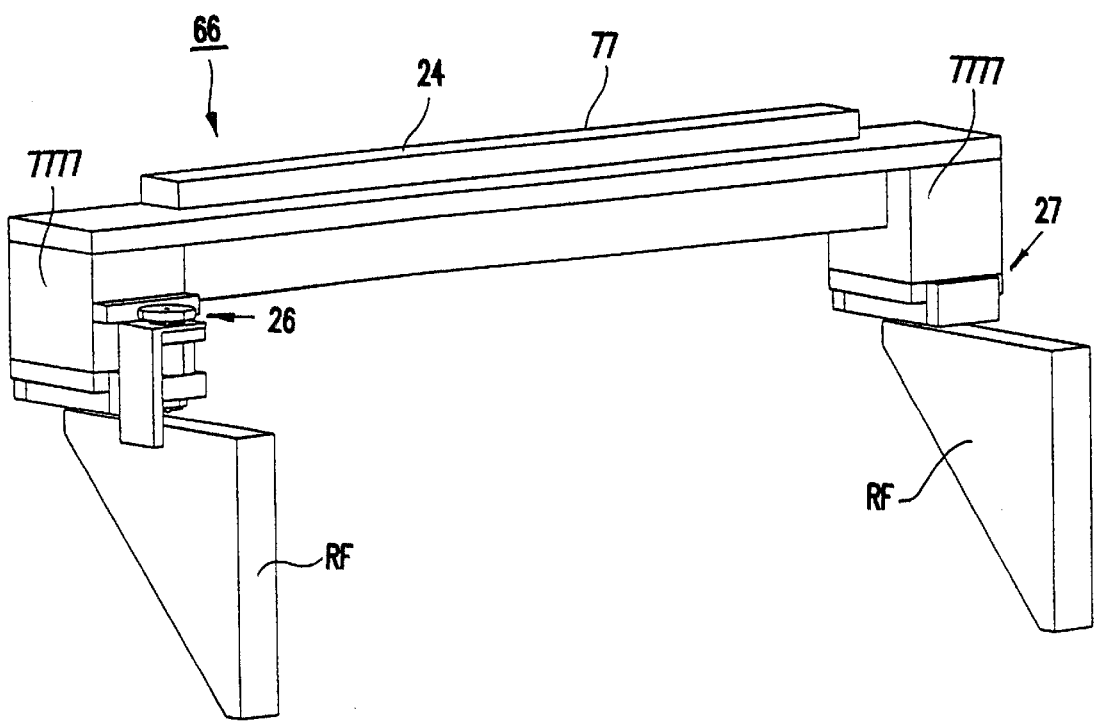

As shown in FIG. 6B, in the reaction force counter mass assembly 66, the trim motor 19 connects to the countermass 77 with a band drive 26 mechanism. As further shown in FIG. 6B, a one-axis air bearing guide 27 may be used. This guide 27 allows for smooth, frictionless motion in one degree of freedom, mainly Y.

As shown in FIGS. 7A through 7E, a preferred embodiment of the invention may be used in a photolithography apparatus. An exemplary apparatus may be seen in FIG. 7A, in which, :near interferometer mirror (IM) and reticles (R), the anti-gravity device 28 is shown. To the right-hand side of FIGS. 7A and 7B, at the side of the apparatus, a reaction force counter mass assembly is shown which includes air bearings 29 and air bearing 30, and reaction mass 31. The bearings 29, 30 allow for free motion in the appropriate directions.

Figure 7A:
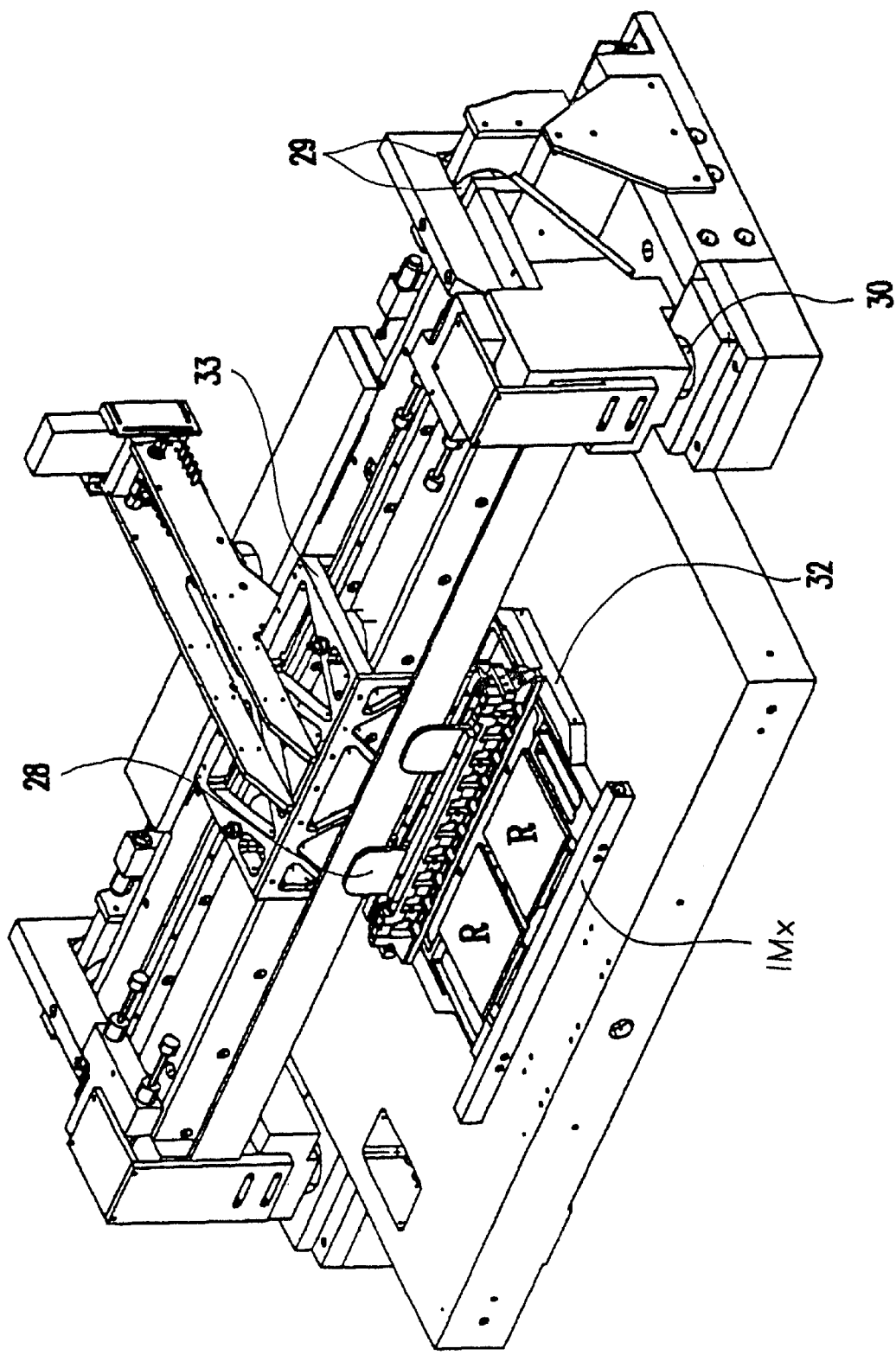
Figure 7B:
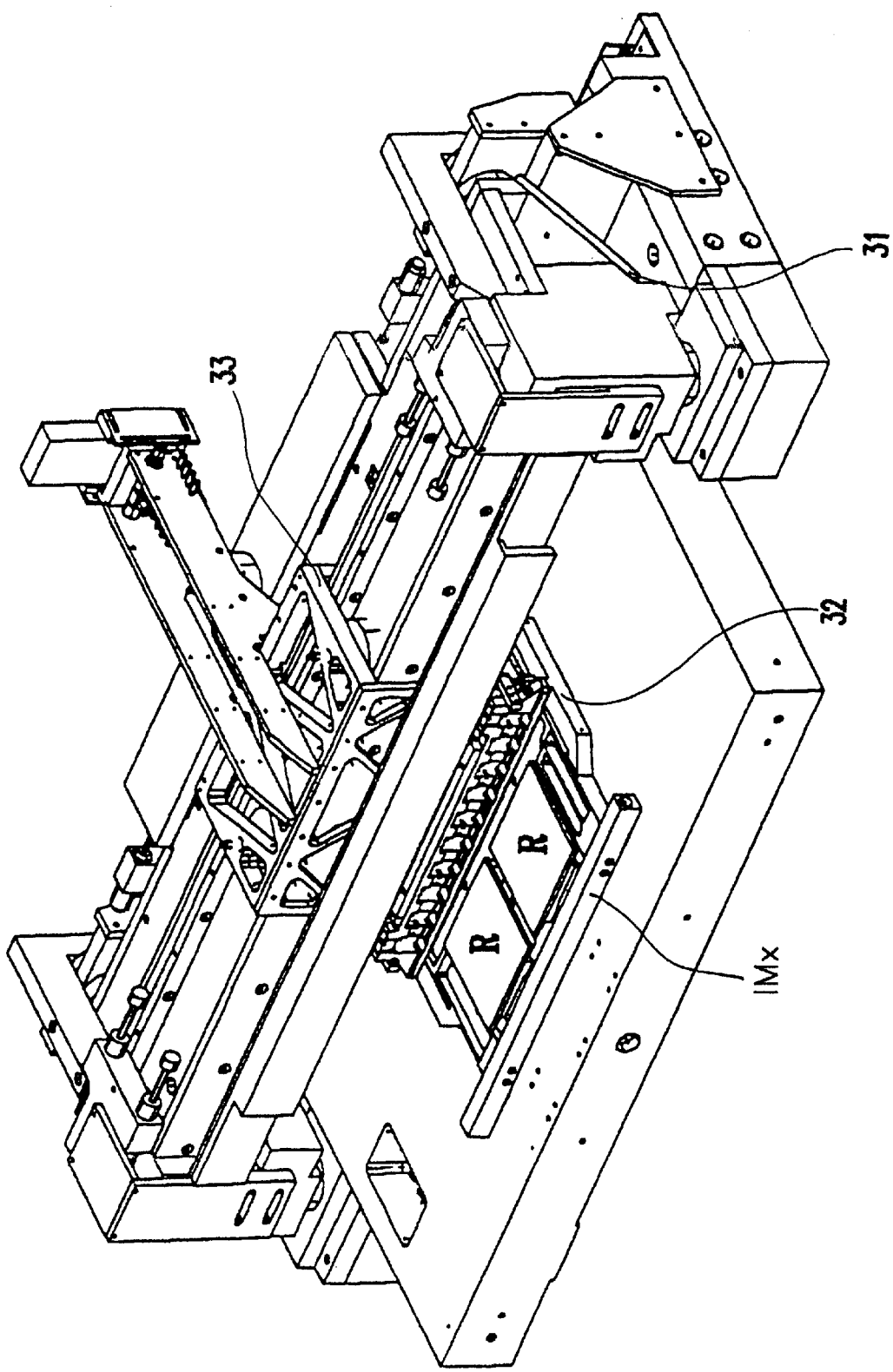
Figure 7C:
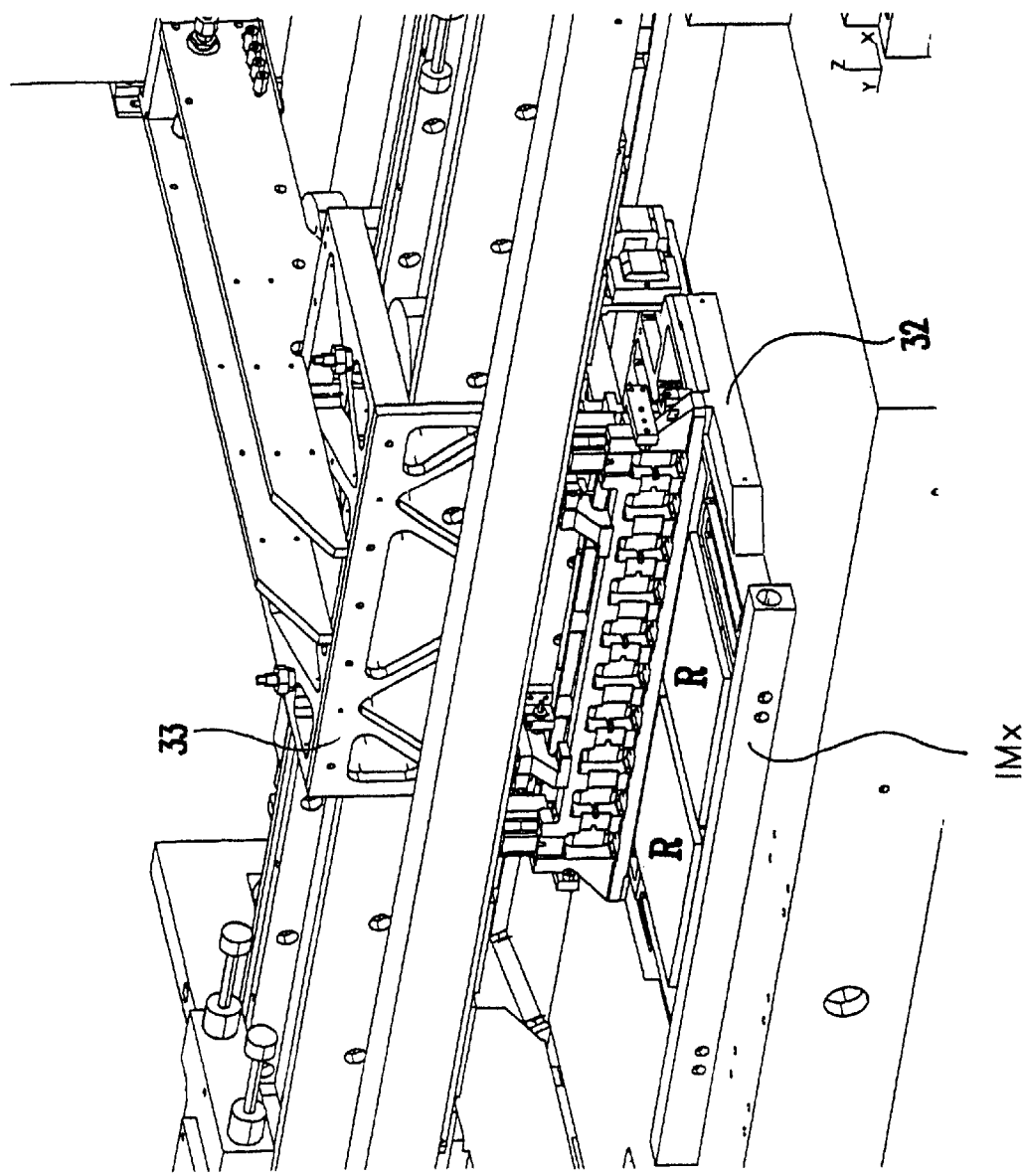
Figure 7D:
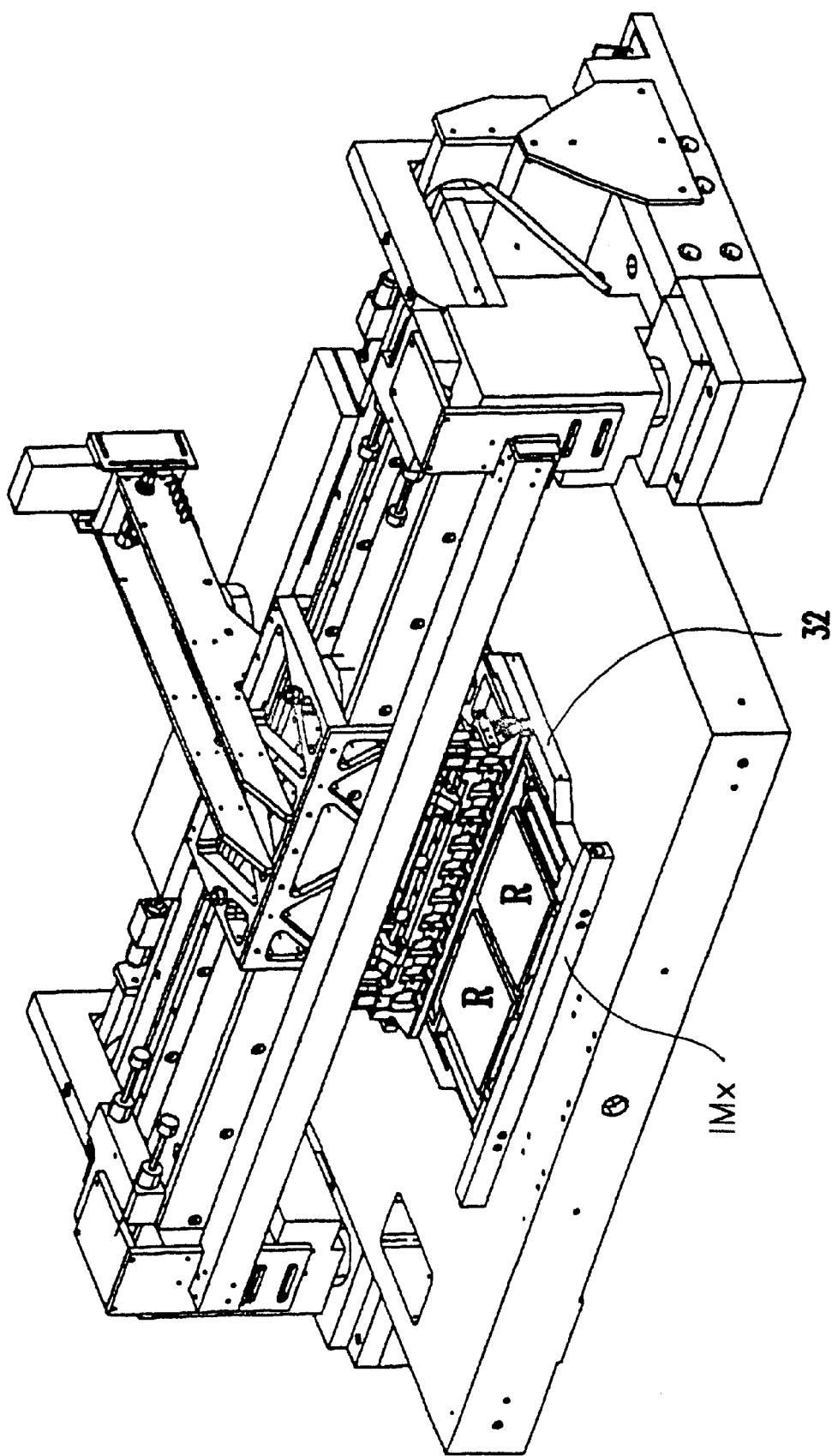

FIG. 7C shows a close-up view of the apparatus in which two reticles (R) are used. In FIGS. 7D and 7E, a fine reticle stage 32 and e-core (sometimes called EI-core) 34 are shown. The e-core actuator is an alternate force actuator to a VCM actuator and those skilled in the art are familiar with e-core actuators. See, e.g., U.S. Pat. No. 6,069,417 issued May 30, 2000 (Nikon Corp.) As far as is permitted, the disclosure in U.S. Pat. No. 6,069,417 is incorporated herein by reference.

In FIG. 7E, in addition to fine reticle stage 32, a coarse reticle stage 33 also is shown. FIG. 7E shows the relative position of the fine stage 32, the coarse stage 33 and the reticle stage base 2. The apparatus depicted in FIG. 7E includes air bearings 35.

The inventive apparatus is easy to manufacture. Adjustments are easily made, and access to electrical components is provided. The weight of the reticle stage 1 is offset by the anti-gravity devices 28, allowing minimal projection lens body frame distortion and possibly no location change in CG.

The inventive apparatus may be used in any lithography system. Examples of lithography systems that may use the invention are those for manufacturing semiconductor devices, and for flat panel displays. In addition to use in a wafer lithography system or wafer inspection system, the invention may be used in other types of devices where the system distortion must be minimized.

The apparatus of FIGS. 1A through 3B provides a high performance reticle stage that positions one, two or multiple reticles in three degrees of freedom with regard to the reticle stage base or PL. That is, it will be appreciated that the reticle stage has three degrees of freedom, and that the reticle(s) positioned on the reticle stage will remain held on the stage and, in operation, are not themselves separately moving in completely independent x, y, z coordinates. (It will be appreciated that in the receiving space for a reticle, a glass pane or dummy reticle having no pattern may be placed if a reticle is not called for.) Most conventional reticle stages could not achieve such freedom in x, y, z coordinates, mainly because of the guide directly underneath and in direct connect with the stage (or at least in sufficiently close contact to preclude freedom of movement in the z direction).

In a preferred embodiment of the present invention, as will especially be appreciated from the thickness of the motor magnets 500, 550A, 550B, and 550C (see FIG. 2) being less than the slot in the reaction force counter mass assembly (see FIGS. 3A and 3B) into which the motor magnets fit, there is a gap of at least about 0.5 nm, i.e., the motor magnets 500, 550A, 550B, and 550C do not completely fill the respective slot into which each is inserted. Thus, there is opportunity for controlled vertical (z) movement of the reticle stage 1, where in conventional reticle stages z movement was not an option. Such vertical movement may be desired, for example, for compensating Z direction disturbances.

As may be seen from FIG. 1A, the respective countermass assemblies basically are aligned horizontally, so that the bottom of the countermass assembly 6 and the bottom of the reaction force countermass assembly 66 are at approximately the same height in the z direction. However, the respective countermass assemblies are not necessarily required to be so aligned, and may vary from each other, such as with respect to how far from the bottom of the reaction force countermass assembly the track is disposed and/or the countermass assembly.

Referring to FIGS. 1A through 7, it will be appreciated that the reticle stage 1, reaction force counter mass assemblies 6 and 66, and other components discussed above may be used in a photolithography system using techniques known to those skilled in the art, such as systems for controlling a reticle stage. It will be appreciated that to operate the reticle stage, a reticle stage controller will be used. Reticle stage controller technology is known for photolithography. As a starting material for a reticle stage controller for driving the reticle stage of the present invention, reference generally may be made to conventional reticle stage controller technology. Particularly, the controller is selected or designed for manipulating the third degree of freedom and the vertical positioning permitted by the present invention. Controllers generally are known for tilting a wafer platform in a photolithography apparatus, see, e.g., U.S. Pat. No. 6,122,036 to Yamasaki et al, issued Sep. 19, 2000 "Entitled Projection Exposure Apparatus and Method", and such controllers maybe used or adapted. As far as is permitted, the disclosure in U.S. Pat. No. 6,122,036 is incorporated herein by reference.

When using the apparatus according to the invention is in operation, a reticle may be delivered to a reticle stage as those skilled in the art know to do. The reticle may be held on the stage using technology known to those in photolithography, such as vacuum technology.

It will be appreciated that the present invention provides a reticle stage that is operable in three degrees of freedom, by an advantageous provision of parts. (The single degree of freedom embodiment shown in FIG. 4 (depicting a single countermass that moves in only the y direction) could be modified to be made free in the x direction by changing the guiding structures, and thus be made into a three degree of freedom embodiment.)

Moreover, the design of the present invention is simple. A reticle stage according to the present invention is relatively simple and made from commercially available components. The present invention provides a reticle stage system with a low moving mass. Control forces act directly on the moving mass, thus minimizing or avoiding the use of linkages or bearings. The present invention desirably maximizes servo bandwidth, by eliminating certain linkages or bearings that reduce servo bandwidth.

Figure 8:
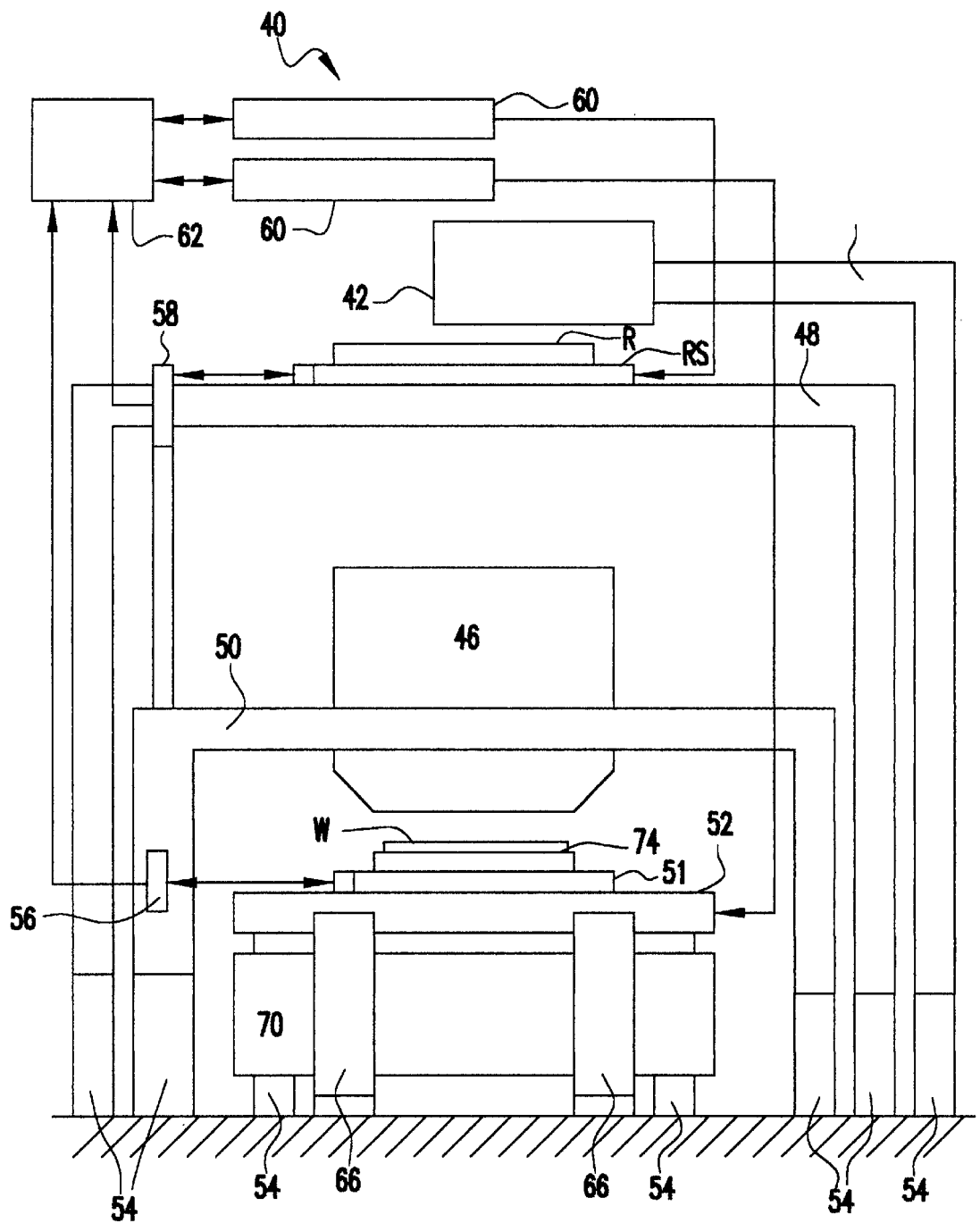
FIG. 8 is a schematic view illustrating a photolithography apparatus according to the invention.

FIG. 8 is a schematic view illustrating a photolithography apparatus 40 incorporating a wafer positioning stage 52 that is driven by a planar motor and a wafer table 51 that is magnetically coupled to the wafer positioning stage 52 in accordance with the principles of the present invention. The planar motor drives the wafer positioning stage 52 by an electromagnetic force generated by magnets and corresponding armature coils arranged in two dimensions. A wafer W is held in place by a wafer chuck 74 which is attached to the wafer table 51. The wafer positioning stage 52 is structured so that it can move in multiple (e.g., three to six) degrees of freedom under precision control by a drive control unit 60 and system controller 62, and position the wafer W at a desired position and orientation relative to the projection optics 46.

The wafer table 51 is levitated in the vertical plane by preferably three voice coil motors (not shown). At least three magnetic bearings (not shown) couple and move the wafer table 51 horizontally. The motor array of the wafer positioning stage 52 is supported by a base 70. The reaction force generated by the wafer stage 52 motion can be mechanically released to the ground through a frame 166, in accordance with the structure described in JP Hei 8-166475 and U.S. Pat. No. 5,528,118, the entire contents of which are incorporated by reference herein.

An illumination system 42 is supported by a frame 72. The illumination system 42 projects radiant energy (e.g., light) through a mask pattern on a reticle R that is supported by and scanned using a reticle stage RS. The reaction force generated by motion of the reticle stage can be mechanically released to the ground through the isolator 54, in accordance with the structures described in JP Hei 8-330224 and U.S. Pat. No. 5,874,820, the entire contents of which are incorporated by reference herein. The light is focused through a projection optical system (lens assembly) 46 supported on a projection optics frame 50 and released to the ground through frame 54.

An interferometer 56 is supported on the projection optics frame 50 and detects the position of the wafer table 5, 1 and outputs the information of the position of the wafer table 51 to the system controller 62. A second interferometer 58 is supported on the projection optics frame 50 and detects the position of the reticle stage RS and outputs the information of the position to the system controller 62.

There are a number of different types of photolithographic devices. For example, apparatus 40 may comprise an exposure apparatus that can be used as a scanning type photolithography system which exposes the pattern from reticle R onto wafer W with reticle R and wafer W moving synchronously. In a scanning type lithographic device, reticle R is moved perpendicular to an optical axis of lens assembly 46 by reticle stage RS and wafer W is moved perpendicular to an optical axis of lens assembly 46 by wafer stage 52. Scanning of reticle R and wafer W occurs while reticle R and W are moving synchronously.

Alternately, exposure apparatus 40 can be a step-and-repeat type photolithography system that exposes reticle R while reticle R and wafer W are stationary. In the step and repeat process, wafer W is in a constant position relative to reticle R and lens assembly 46 during the exposure of an individual field. Subsequently, between consecutive exposure steps, wafer W is consecutively moved by wafer stage 52 perpendicular to the optical axis of lens assembly 46 so that the next field of semiconductor wafer W is brought into position relative to lens assembly 46 and reticle R for exposure. Following this process, the images on reticle R are sequentially exposed onto the fields of wafer W so that the next field of semiconductor wafer W is brought into position relative to lens assembly 46 and reticle R.

However, the use of apparatus 40 provided herein is not limited to a photolithography system for semiconductor manufacturing. Apparatus 40 (e.g., an exposure apparatus), for example can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, machine tools, metal cutting machines, and inspection machines.

In the illumination system 42, the illumination source can be g-line (436 nm), i-line (365 nm), KrF excimer laser (248 nm), ArF excimer laser (193 nm) and $F_2$ laser (157 nm). Alternatively, the illumination source can also use charged particle beams such as x-ray and electron beam. For instance, in the case where an electron beam is used, thermionic emission type lanthanum hexaboride ($LaB_6$) or tantalum (Ta) can be used as an electron gun. Furthermore, in the case where an electron beam is used, the structure could be such that either a mask is used or a pattern can be directly formed on a substrate without the use of a mask.

With respect to lens assembly 46, when far ultra-violet rays such as the excimer laser is used, glass materials such as quartz and fluorite that transmit far ultra-violet rays are preferably used. When the $F_2$ type laser or x-ray is used, lens assembly 46 should preferably be either catadioptric or refractive (a reticle should also preferably be a reflective type), and when an electron beam is used, electron optics should preferably comprise electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure. Japan Patent Application Disclosure No. 8-171054 published in the Official Gazette for Laid-Open Patent Applications and its counterpart U.S. Pat. No. 5,668,672, as well as Japanese Patent Application Disclosure No. 10-20195 and its counterpart U.S. Pat. No. 5,835,275. In these cases, the reflecting optical device can be a catadioptric optical system incorporating a beam splitter and concave mirror. Japanese Patent Application Disclosure No. 8-334695 published in the Official Gazette for Laid-Open Patent Applications and its counterpart U.S. Pat. No. 5,689,377 as well as Japanese Patent Application Disclosure No. 10-3039 and its counterpart U.S. Pat. No. 5,892,117 also use a reflecting-refracting type of optical system incorporating a concave mirror, etc., but without a beam splitter, and can also be employed with this invention. The disclosures in the above-mentioned U.S. patents, as well as the Japanese patent applications published in the Office Gazette for Laid-Open Patent Applications are incorporated herein by reference.

Further, in photolithography systems, when linear motors that differ from the motors shown in the above embodiments (see U.S. Pat. Nos. 5,623,853 or 5,528,118) are used in one of a wafer stage or a reticle stage, the linear motors can be either an air levitation type employing air bearings or a magnetic levitation type using Lorentz force or reactance force. Additionally, the stage could move along a guide, or it could be a guideless type stage which uses no guide. The disclosures in U.S. Pat. Nos. 5,623,853 and 5,528,118 are incorporated herein by reference.

Alternatively, one of the stages could be driven by a planar motor, which drives the stage by electromagnetic force generated by a magnet unit having two-dimensionally arranged magnets and an armature coil unit having two-dimensionally arranged coils in facing positions. With this type of driving system, either one of the magnet unit or the armature coil unit is connected to the stage and the other unit is mounted on the moving plane side of the stage.

Movement of the stages as described above generates reaction forces which can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. The disclosures in U.S. Pat. Nos. 5,528,118 and 5,874,820 and Japanese Patent Application Disclosure No. 8-330224 are incorporated herein by reference.

As described above, a photolithography system according to the above described embodiments can be built by assembling various subsystems in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and humidity are controlled.

Figure 9:
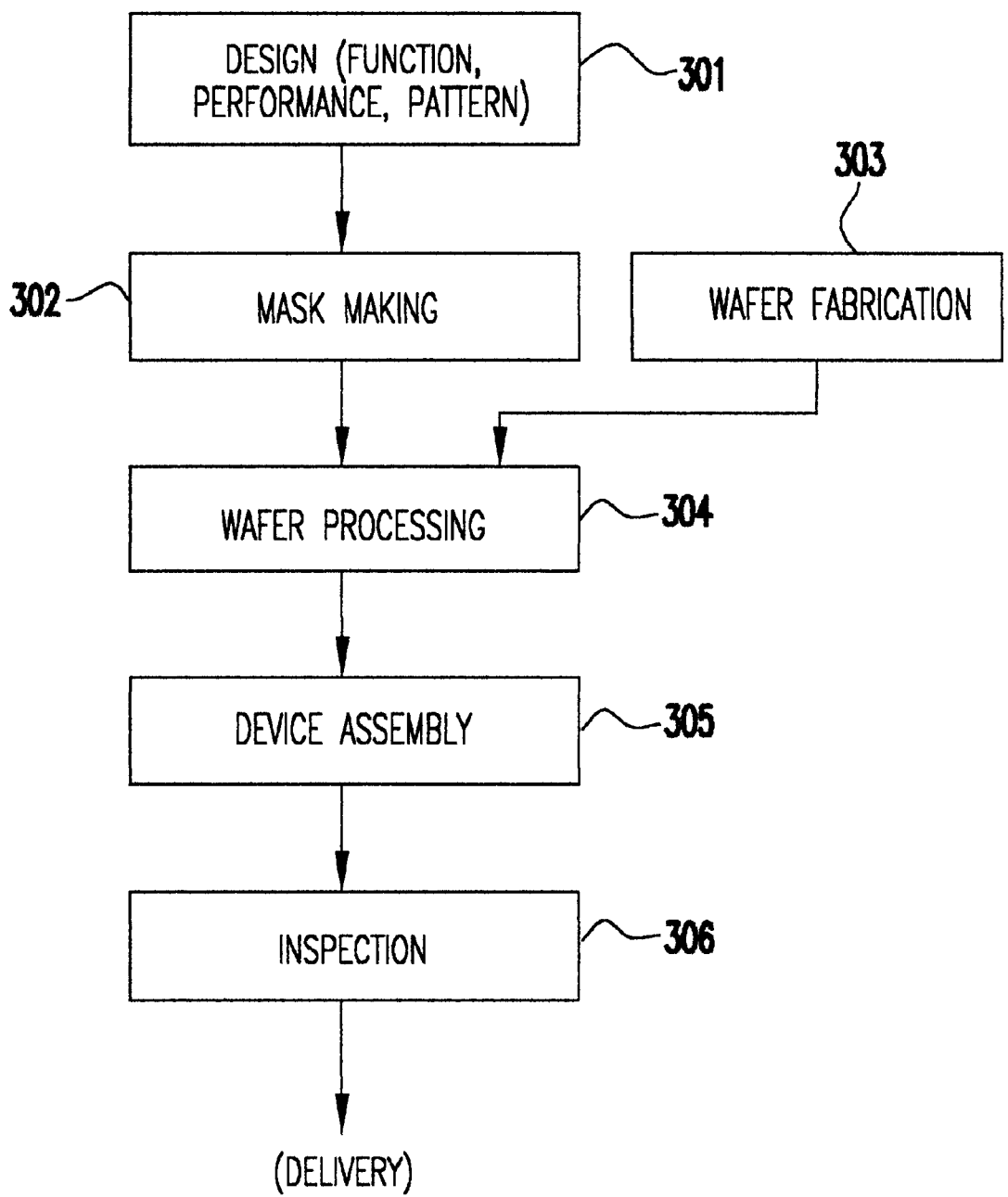
FIG. 9 is flow chart showing semiconductor device fabrication.

Further, semiconductor devices can be fabricated using the above described systems, by the process shown generally in FIG. 9. In step 301 the device's function and performance characteristics are designed. Next, in step 302, a mask (reticle) having a pattern is designed according to the previous designing step, and in a parallel step 303, a wafer is made from a silicon material. The mask pattern designed in step 302 is exposed onto the wafer from step 303 in step 304 by a photolithography system described hereinabove consistent with the principles of the present invention. In step 305 the semiconductor device is assembled (including the dicing process, bonding process and packaging process), then finally the device is inspected in step 306.

Figure 10:
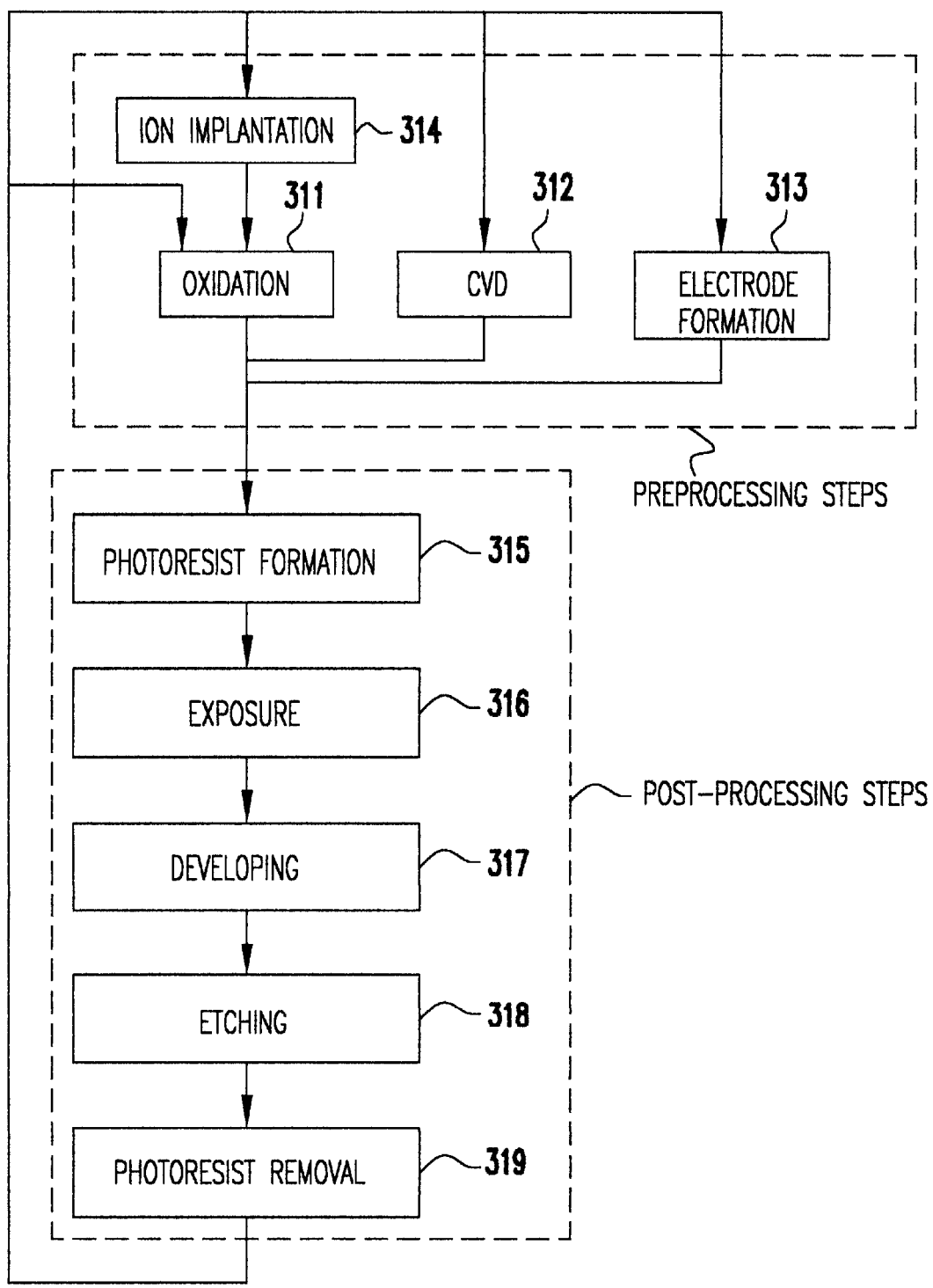
FIG. 10 is a flow chart showing wafer processing.

FIG. 10 illustrates a detailed flowchart example of the above-mentioned step 304 in the case of fabricating semiconductor devices. In step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above-mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially in step 315 (photoresist formation step), photoresist is applied to a wafer. Next, in step 316 (exposure step), the above-mentioned exposure apparatus is used to transfer the circuit pattern of a mask (reticle) to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed.

Multiple circuit patterns are formed by repetition of these pre-processing and post-processing steps.

It will be apparent to those skilled in the art that various modifications and variations can be made in the methods described, in the stage device, the control system, the material chosen for the present invention, and in construction of the photolithography systems as well as other aspects of the invention without departing from the scope or spirit of the invention. While the invention has been described in terms of preferred embodiments, those skilled in the art will recognize that the invention can be practiced with modification within the spirit and scope of the appended claims.

Having thus described our invention, what we claim as new and desire to secure by Letters Patent is as follows:

1. An apparatus comprising:
   a stage;
   a reaction-force countermass assembly; and
   an anti-gravity device between the stage and the reaction force-countermass assembly, the anti-gravity device configured to offset the weight of the stage to the reaction force-countermass assembly,
   wherein the stage is in contact with anti-gravity devices extending from a single reaction force-countermass assembly located on one side of the stage.

2. The apparatus of claim 1, wherein the stage is a reticle stage.

3. The apparatus of claim 1, including a bridge shaped reticle stage.

4. The apparatus of claim 1, including anti-gravity devices supporting the stage on a pair of reaction force-countermass assemblies located adjacent to the stage.

5. The apparatus of claim 1, wherein the stage is a fine stage.

6. The apparatus of claim 1, wherein the stage is a coarse stage.

7. The apparatus of claim 1, wherein the countermass assembly includes a countermass having three degrees of freedom.

8. The apparatus of claim 1, wherein the anti-gravity device is selected from the group consisting of a flexure, a spring, an air or hydraulic piston, a magnet, an electrostatic device, an eelctromagnetic bearing, an air bellows and a pressurized device.

9. The apparatus of claim 4, wherein one of the reaction force countermass assemblies are located on one side of the stage.

10. The apparatus of claim 4, wherein the reaction force countermass assemblies are located on two sides of the stage.

11. The apparatus of claim 4, wherein the reaction force countermass assemblies are above the stage.

12. The apparatus of claim 4, wherein the reaction force countermass assemblies are below the stage.

13. The apparatus of claim 1, wherein between the countermass assembly and the stage is provided a friction-reducing bearing.

14. An exposure apparatus comprising:
   an illumination system that irradiates radiant energy; and
   an apparatus comprising: a stage; a reaction force-countermass assembly; and an anti-gravity device between the stage and the reaction force-countermass assembly, the anti-gravity device configured to offset the weight of the stage to the reaction force-countermass assembly, the apparatus disposing an object on a path of radiant energy,
   wherein the stage is in contact with anti-gravity devices extending from a single reaction force-countermass assembly located on one side of the stage.

15. A device manufactured with the exposure apparatus of claim 14.

16. The apparatus of claim 1, further including a base that supports the stage with a bearing device that is disposed between the stage and the base.

17. An apparatus comprising:
   a stage;
   a mover that includes a first assembly that is connected to the stage and a second assembly that interacts with the first assembly;
   a countermass assembly connected to the second assembly of the mover, the countermass assembly including a bearing guide;
   a bearing device connected to the stage, the bearing device moving on the bearing guide of the countermass assembly;
   a countermass support member that supports the countermass assembly so as to substantially move in a least a first direction;
   a countermass mover connected to the countermass assembly, the countermass mover acting between the countermass assembly and the countermass support member, the countermass mover comprises a first motor for motion along a first direction and a second motor for motion along a second direction that differs from the first direction;
   a base that supports the stage; and
   a second bearing device that is disposed between the stage and the base.

18. The apparatus of claim 17, wherein the countermass mover comprises a first motor for motion along a first direction and a second motor for motion along a second direction that differs from the first direction.

19. The apparatus of claim 17, wherein the mover moves the table at least in two directions.

20. The apparatus of claim 17, wherein the countermass assembly has at least two degrees of freedom.

21. The apparatus of claim 17, wherein the countermass mover comprises a first motor for motion along a first direction and a plurality of second motors for motion along a second direction that differs from the first direction.

22. An exposure apparatus comprising:
   an illumination system that irradiates radian energy; and
   an apparatus comprising: a stage; a mover that includes a first assembly that is connected to the stage and a second assembly that interacts with the first assembly; a countermass assembly connected to the second assembly of the mover, the countermass assembly including a bearing guide; a bearing device connected to the stage, the bearing device moving on the bearing guide of the countermass assembly; a countermass support member that supports the countermass assembly so as to be substantially moved in at least a first direction; and a countermass mover connected to the countermass assembly, the countermass mover acting between the countermass assembly and the countermass support member, the countermass mover comprises a first motor for motion along a first direction and a second motor for motion along a second direction that differs from the first direction, a base that supports the stage; and a second bearing device that is disposed between the stage and the base, the apparatus disposing an object on a path of the radiant energy.

23. The exposure apparatus of claim 22, wherein:
   the exposure apparatus transfers a pattern of a mask onto an object; and
   the stage is a mask stage that holds the mask.

24. The exposure apparatus of claim 22, wherein the countermass support member is connected to a frame that is disposed independently from at least one of a base and the illumination system, wherein the base supports the stage.

25. The exposure apparatus of claim 24, wherein a part of the countermass mover is connected to the frame via the countermass support member.

26. An apparatus comprising:
   holding means for holding an object;
   moving means for moving the holding means, the moving means including a first assembly that is connected to the holding means and a second assembly that interacts with the first assembly;

reaction canceling means for canceling a reaction force caused by driving of the holding means, the reaction canceling means including bearing guide means;

bearing means for translating the holding means on the bearing guide means;

support means for supporting the reaction canceling means so as to be substantially move in at least a first direction; and driving means for generating force between the reaction canceling means and the supporting means, the driving means comprises a first motor for motion along a first direction and a second motor for motion along a second direction that differs from the first direction;

base means for supporting the holding means; and second bearing means for transmitting the holding means on the base means.

27. An apparatus comprising:

a stage;

a reaction force-countermass assembly; and an anti-gravity device between the stage and the reaction force-countermass assembly, the anti-gravity device configured to offset the weight of the stage to the reaction force-countermass assembly, wherein the anti-gravity device is selected from the group consisting of a flexure, a spring, an air or hydraulic piston, a magnet, an electrostatic device, an electromagnetic bearing, an air bellows and a pressurized device.

28. An apparatus comprising:

a stage;

a reaction force-countermass assembly;

an anti-gravity device between the stage and the reaction force countermass-assembly, the anti-gravity device configured to offset the weight of the stage to the reaction force-countermass assembly; and a base that supports the stage with a bearing device that is disposed between the stage and the base.

29. An exposure apparatus comprising:

an illumination system that irradiates radiant energy; and an apparatus comprising: a stage; a reaction force-countermass assembly; and an anti-gravity device between the stage and the reaction force-countermass assembly, the anti-gravity device configured to offset the weight of the stage to the reaction force-countermass assembly, the apparatus disposing an object on a path of radiant energy, wherein the anti-gravity device is selected from the group consisting of a flexure, a spring, an air or hydraulic piston, a magnet, an electrostatic device, an electromagnetic bearing, an air bellows and a pressurized device.

30. An exposure apparatus comprising:

an illumination system that irradiates radiant energy;

an apparatus comprising: a stage; a reaction force-countermass assembly; and an anti-gravity device between the stage and the reaction force-countermass assembly, the anti-gravity device configured to offset the weight of the stage to the reaction force-countermass assembly, the apparatus disposing an object on a path of radiant energy; and a base that supports the stage with a bearing device that is disposed between the stage and the base.

* * * * *